(12) United States Patent
Cooke et al.

(10) Patent No.: US 7,890,899 B2
(45) Date of Patent: Feb. 15, 2011

(54) VARIABLE CLOCKED SCAN TEST IMPROVEMENTS

(75) Inventors: Laurence H. Cooke, Los Gatos, CA (US); Bulent I. Dervisoglu, Mountain View, CA (US)

(73) Assignee: Intellectual Ventures I LLC, Wilmington, DE (US)

( * ) Notice: Subject to any disclaimer, the term of this patent is extended or adjusted under 35 U.S.C. 154(b) by 399 days.

(21) Appl. No.: 12/046,336

(22) Filed: Mar. 11, 2008

(65) Prior Publication Data

US 2008/0163020 A1 Jul. 3, 2008

Related U.S. Application Data

(63) Continuation of application No. 11/182,809, filed on Jul. 18, 2005, now Pat. No. 7,353,470.

(60) Provisional application No. 60/651,993, filed on Feb. 14, 2005.

(51) Int. Cl.
*G06F 17/50* (2006.01)

(52) U.S. Cl. .................. 716/4; 716/1; 716/3; 716/5

(58) Field of Classification Search ............... 716/1, 716/3, 4, 5, 7, 9; 714/726, 727, 732
See application file for complete search history.

(56) References Cited

U.S. PATENT DOCUMENTS

| | | | | |
|---|---|---|---|---|
| 5,602,855 | A | * | 2/1997 | Whetsel .................. 714/727 |
| 5,631,911 | A | * | 5/1997 | Whetsel .................. 714/727 |
| 5,968,141 | A | | 10/1999 | Tsai |
| 5,991,909 | A | | 11/1999 | Rajski et al. |
| 6,611,934 | B2 | * | 8/2003 | Whetsel .................. 714/727 |
| 7,111,209 | B2 | | 9/2006 | Rajski et al. |
| 7,234,092 | B2 | | 6/2007 | Cooke |
| 2003/0229834 | A1 | | 12/2003 | Cooke |
| 2005/0140773 | A1 | | 6/2005 | O'Hara et al. |

* cited by examiner

*Primary Examiner*—Sun J Lin
(74) *Attorney, Agent, or Firm*—Connolly Bove Lodge & Hutz LLP

(57) ABSTRACT

Addition of specific test logic may improve the level of test vector compression achieved from existing variable scan test logic. Methods for determining the compressed vectors' states, given the desired uncompressed vectors' values may be used, and techniques for selectively enabling test or other features on a chip by inserting the proper code or codes into the chip may further be used. Techniques may be used to incorporate and apply various types of reset operations to multiple strings of variable scan test logic, as may methods to minimize the test vector compression computation time.

14 Claims, 17 Drawing Sheets

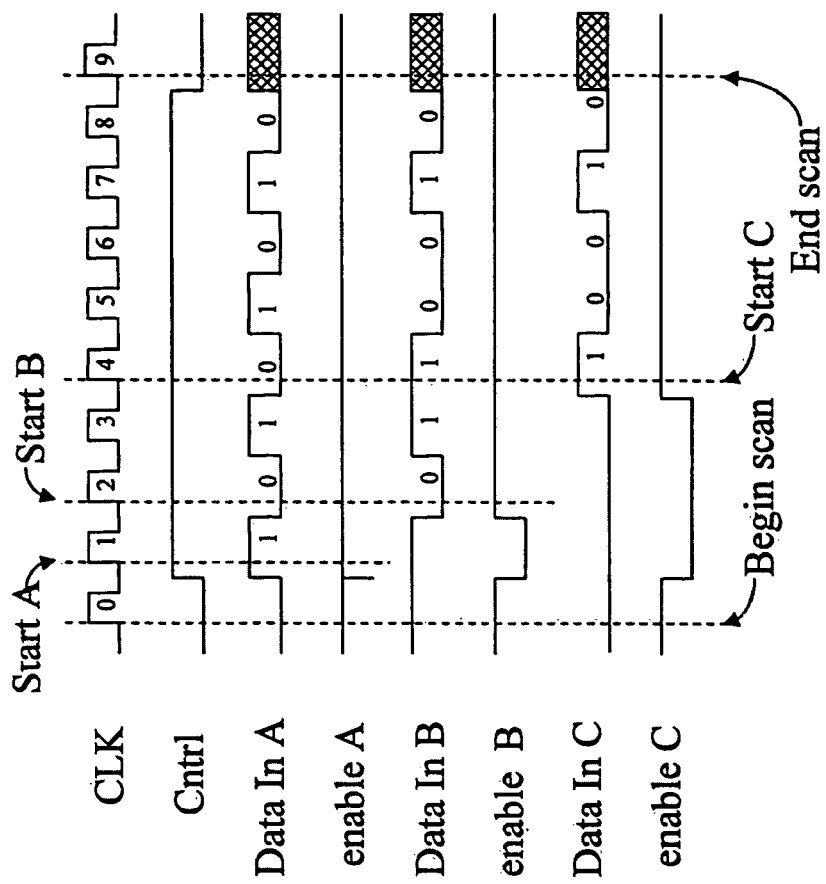
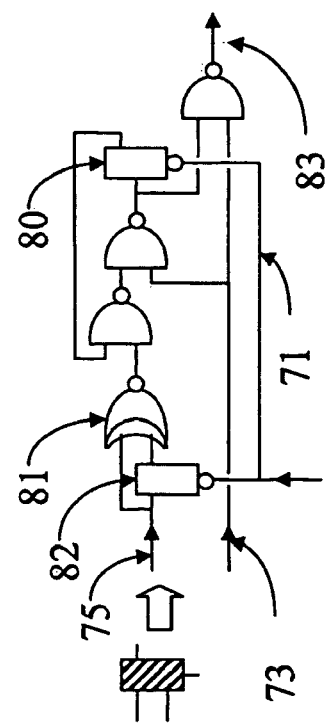
Figure 8
Figure 9

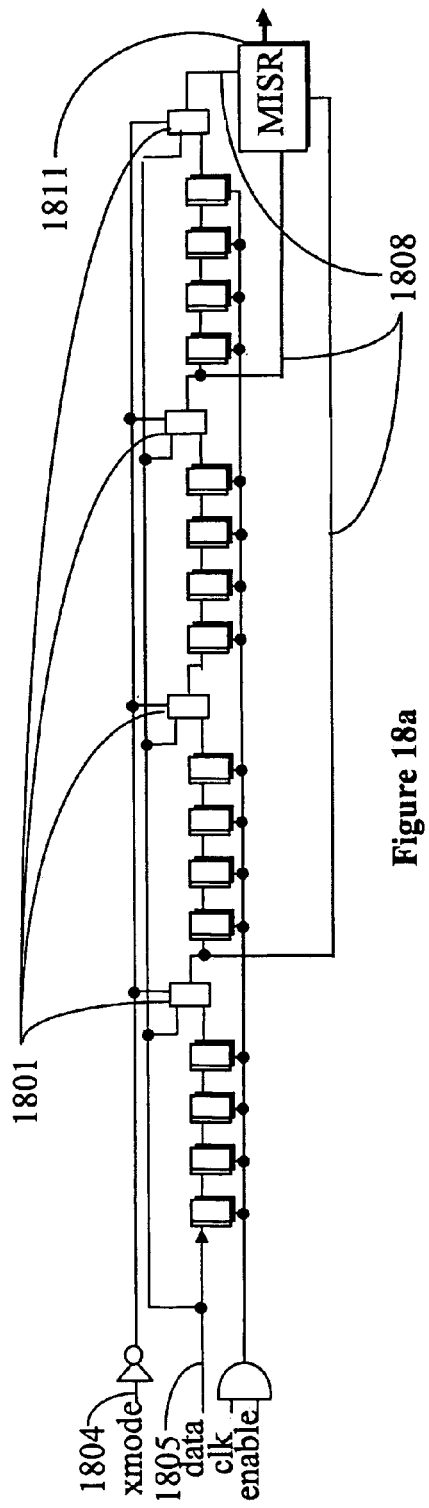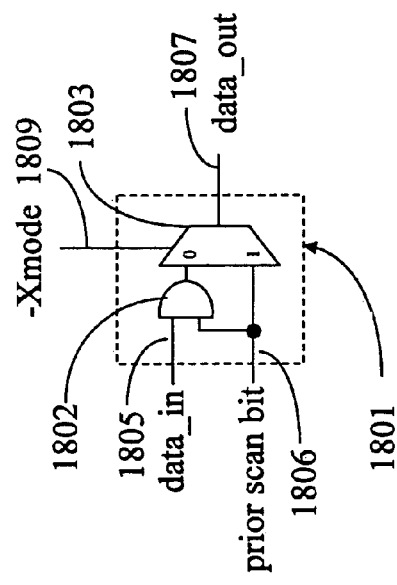
Figure 18a
*Prior Art*
Figure 18b
*Prior Art*

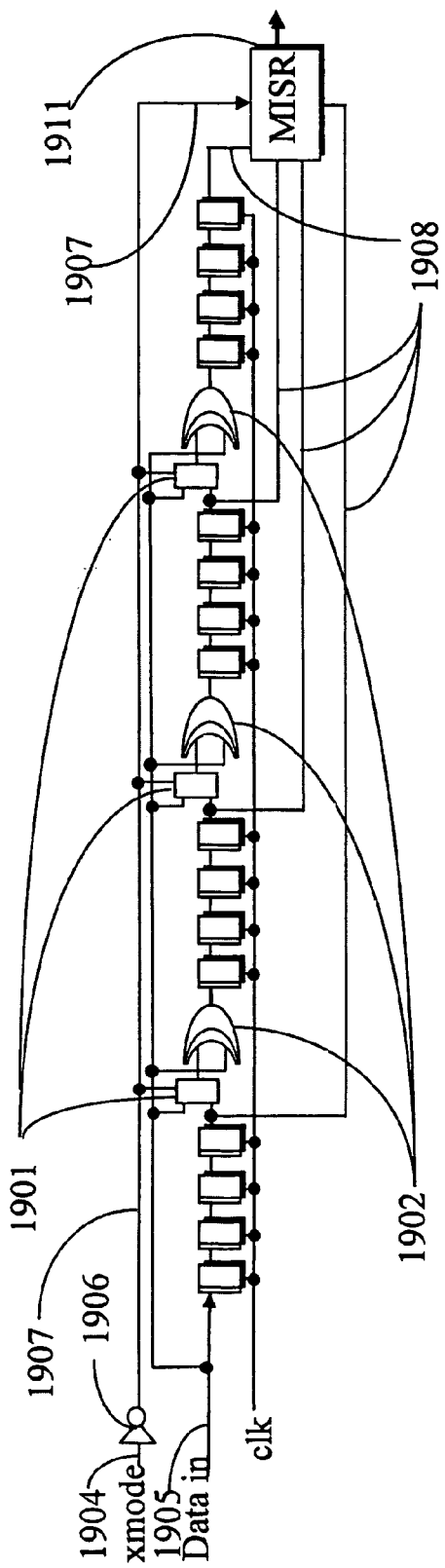
Figure 19
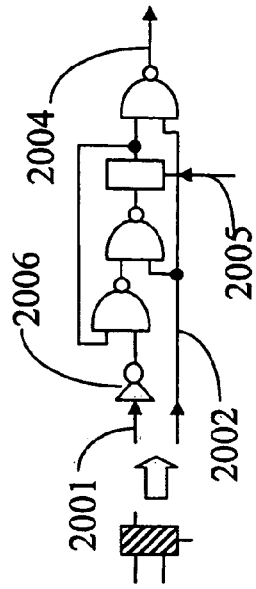
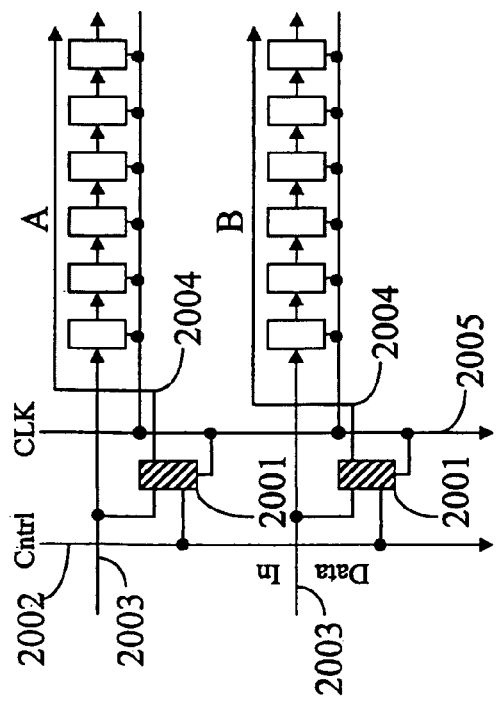
Figure 20a
Figure 20b

VARIABLE CLOCKED SCAN TEST IMPROVEMENTS

CROSS-REFERENCE TO RELATED APPLICATION

This application is a continuation of U.S. patent application Ser. No. 11/182,809, filed on Jul. 18, 2005 (and which has now issued as U.S. Pat. No. 7,353,470), which claims the priority of U.S. Provisional Application No. 60/651,993, filed on Feb. 14, 2005, both of which are incorporated by reference herein.

FIELD OF THE INVENTION

The present invention is related to improvements in digital logic testing, particularly improvements to scan based digital logic testing, which uses check-sum or signature register logic and exclusive-or operations on serial shift string logic, and improvements to the corresponding software techniques to reduce test data volume and minimize test time.

BACKGROUND AND SUMMARY OF THE INVENTION

Prior co-pending U.S. patent application Ser. No. 10/351,276, filed on Jan. 24, 2003, published as U.S. Published Patent Application No. 20030229834 and U.S. patent application Ser. No. 10/750,949, filed on Jan. 5, 2004, published as U.S. Published Patent No. 20040148554, both by the inventors, and U.S. patent application Ser. No. 10/355,941, filed, Jan. 31, 2003, published as U.S. Published Patent Application No. 20030131298, and U.S. Pat. No. 5,991,909, filed Jan. 23, 1999, both by Rajski et. al., have demonstrated techniques to reduce digital test time and volume. The present disclosure improves on the work done in the above prior art.

Both U.S. patent application Ser. Nos. 10/355,941, and 10/750,949, respectively describe forward and reverse symbolic simulations to determine the appropriate patterns to apply to their respective compression test logic. U.S. patent application Ser. No. 10/355.941 presents a forward symbolic simulation, where variables are used in place of the compressed values to be scanned into the test logic. These variables are combined with other variables into logical expressions as they pass through exclusive-or logic gates on each subsequent shift cycle. For example, if the variables A and B are on the inputs of an XOR function then the expression A XOR B would be placed on the output.

The test logic structure shown in FIG. 1, is described in U.S. patent application Ser. No. 10/351,276. U.S. patent application Ser. No. 10/750,949 presents a reverse symbolic simulation to compress test patterns that are applied to structures such as the one shown in FIG. 1. The simulation starts with the required state and simulates in reverse time to determine the compressed input states necessary to meet those required states. In this case variables are introduced or added to existing expressions on both inputs of exclusive-or gates as the required values pass through the gates in during each reverse shift. In other words, if the required value was a 1, a variable and its opposite are placed on the inputs of the exclusive-or. Similarly, if a variable A exists on the output of an exclusive-or function then a new variable B is created, and the expressions A XOR B and A XOR-B are placed on the function's inputs. This has the advantage over the forward algorithm of producing fewer, shorter expressions,. significantly reducing the computation time.

Both algorithms evaluate the expressions, stopping when a set of values can be assigned to the variables in those expressions, which satisfies the corresponding required care-in states. Still, both algorithms require excessive amounts of computation when trying to solve for vectors with a large number of required care-in values, primarily because conflicts arise in the evaluation of many different equations, all containing the same variables.

As a result further improvements can be made by eliminating the expressions altogether. This improved algorithm also applies to the structure shown in FIG. 1, but in this case the evaluation of expressions can instead be done by repeatedly exclusive-oring a vector comprised of the variables shifted by the shift count of each exclusive-or in the chain, and exclusive-oring the result with the original existing vector. Repeatedly selectively setting one or more variables to known states, re-evaluating, and comparing the computed values to the required care-in states, produces the required compressed states in the vector of variables, without creating a large number of complex expressions. This technique reduces the computation time to arrive at a compressed solution, regardless of whether the simulation is in forward or reverse time. In addition, an estimator can be incorporated into this process, which rapidly determines if a solution to the large number of equations and variables is possible. Employing such an estimator and skipping over shift states that will not produce a solution can further reduce the computation time. Furthermore, by keeping track of the number of care-in locations that use each variable during the estimator's computation, it is possible to save those care-in locations that have unique variables, variables whose usage count is one, and eliminate them, in the same manner as care-in locations without variables, from the lengthy compression calculations, to be processed only after a solution for the rest of the care-in locations has been found, since we know a priori that regardless of the states of the other variables, setting the unique variable associated with the saved care-in location to the proper state will ensure the care-in location has the correct value.

It has also been determined by the inventors that the ratio of compression is, in part, related to the number of segments created by the exclusive-or functions and the percentage of required care-ins to be set, and not the length of the scan string. Furthermore, to obtain the best compression ratios, the number of segments should increase as the as the percentage of required care-ins to be set decreases. Prior U.S. patent application Ser. No. 10/351,276, described a way to selectively enable some or all of the exclusive-or gates in a scan string, as shown in FIG. 6. Traditionally test sets require a large number of care-in inputs to be set in the initial vectors, decreasing to a very small percentage of required care-in values in the last vectors in the set. By judiciously using this selection technique, better compression can be achieved over the whole vector set. In addition, these selective enables can either be:

1) disabled to perform uncompressed scan, or
2) enabled to any level of compression, or
3) enabled for better compression.

Furthermore, it is observed, by the inventors, that Design Engineers, who create the test logic, have little incentive to spend the time and money necessary to get better compression of their test patterns. On the other hand, Manufacturing Engineers see the direct benefits of reduced test costs when compressing the test patterns of their high volume chips. As such, the present disclosure describes a method whereby the Design Engineers can supply the hardware necessary to accept compressed patterns without compressing the patterns themselves, thereby allowing the Manufacturing Engineers to reduce their test costs when it becomes necessary to do so. In addition, the inventors describe extensions to the above selection technique, which unlock the selective enables when needed by the Manufacturing Engineers. This concept is further generalized to apply to any combination of hardware features enabled by some keys embedded in software that utilizes such key enabled features.

Also, the U.S. patent application Ser. No. 10/351,276 described a way align the compressed patterns being applied to multiple parallel scan strings, each of which requires a different number of clocks. This technique used the value on the data input on each scan string to selectively enable the scan string's clock, as shown in FIG. 7. In the prior art, the clock enable logic 76 required the data input 75 to transition from a logic 1 level a logic 0 level to enable each string's clock 70; an additional clock cycle was added to each test pattern for this transition. In the present disclosure the inventors show a way to enable each string's clock on the transition to the first value to be clocked in, saving the initial clock cycle.

A primary assumption behind this compression technology is to take advantage of the existing state in the scan chain in order to reduce the number of required shifts needed to generate the next state. An artifact of this assumption is that existing errors from one cycle can propagate through the decompression process to subsequent cycles of the testing, which is not what some designers need when, during performance testing, the erroneous states put an otherwise good chip into a potentially destructive state. Previously the only way to create a deterministic initial staring state is to shift it into the entire scan string. A scan chain wide reset could ensure there is a deterministic initial starting state prior to decompressing each pattern, or logic similar to the X-blocking circuitry presented in U.S. patent application Ser. No. 10/750,949, which is also shown in FIGS. 18a and 18b, could be employed to set the scan string to 0s while decompressing the next test. Both these and other alternatives provide ways to limit the clocking overhead of deterministic tests.

Finally, requiring deterministic tests in chips with multiple scan strings requires modifications to the existing compression methodology, and as a result, can eliminate the need to control the clocking of individual scan strings in the chips. Eliminating the dependency on prior test results to generate the next test also decouples the compression computation from Automatic Test Pattern Generation (ATPG) or simulation, and may, with proper resetting, permanently decouple the individual tests from each other, allowing reorganization of the vectors at manufacturing test.

BRIEF DESCRIPTION OF THE DRAWINGS

Embodiments of the invention will now be described in conjunction with the drawings, in which:

FIG. 8 is a diagram of improved multiple scan string clock enable logic, FIG. 9 is a detailed timing diagram corresponding to the clock enable logic in FIG. 8, FIG. 18a shows a scan string with the addition of X-blocking circuits, FIG. 18b shows the details of an X-blocking circuit, FIG. 19 shows another scan string with the addition of X-blocking circuits, FIG. 20a shows a high level diagram of logic to control the X-blocking circuits on multiple scan strings, FIG. 20b shows the detailed logic to control the X-blocking circuits on a single scan string.

DESCRIPTION OF SPECIFIC EMBODIMENTS

Figure 2:
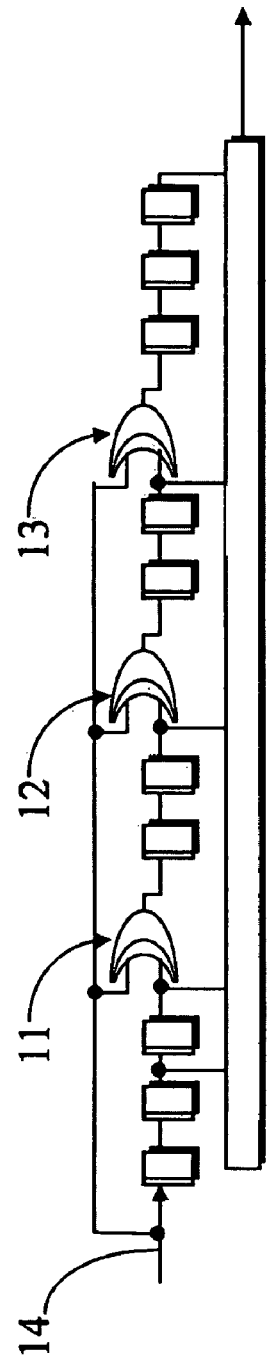
FIG. 2 is a diagram of a segmented scan string as used for Table 1.
Figure 3:
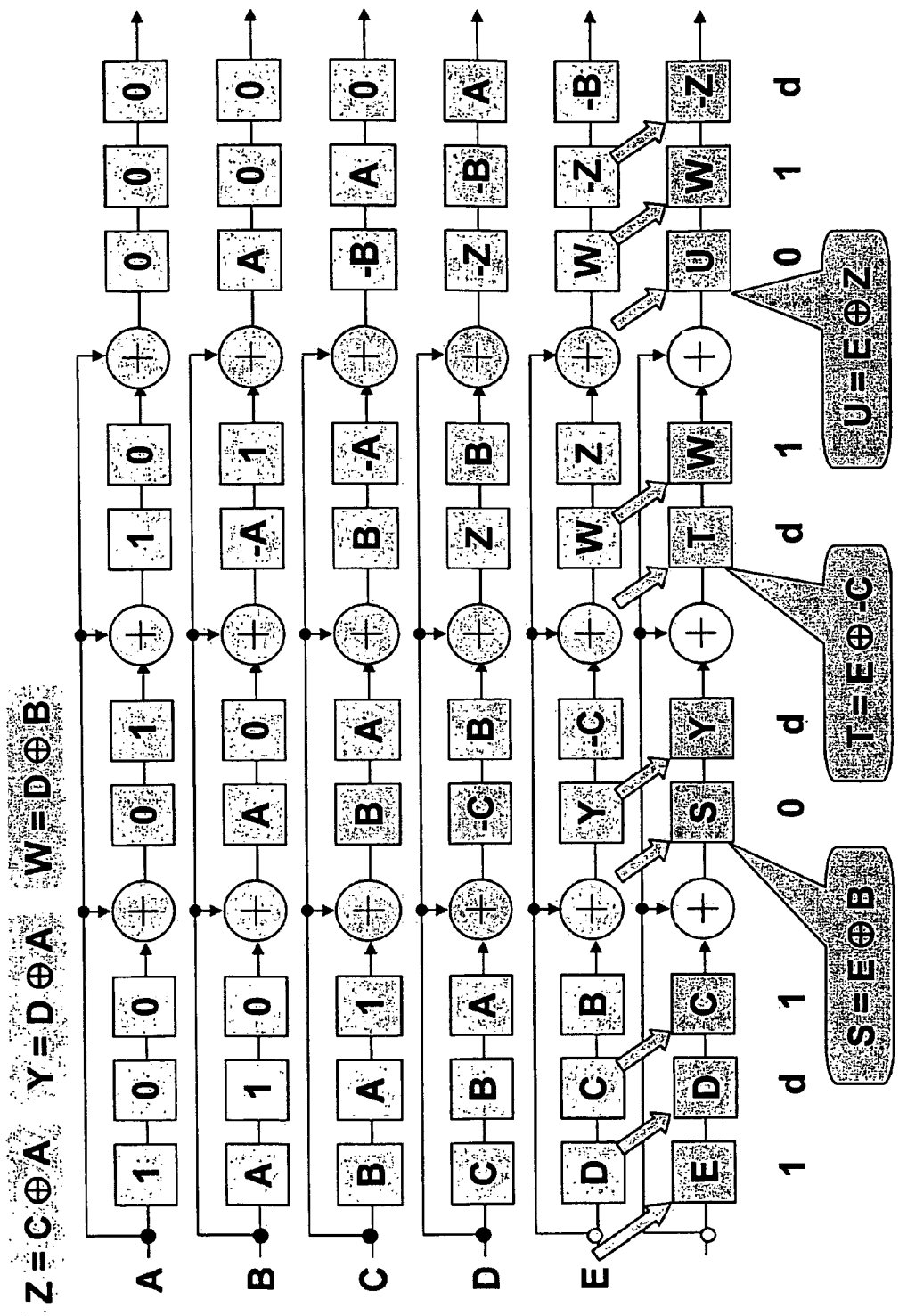
FIG. 3 is a prior art diagram depicting forward symbolic simulation.

The prior art in FIG. 3, from U.S. patent application Ser. No. 10/750,949, depicts five shift cycles of forward symbolic simulation on a 10 bit long scan string broken into four segments by the addition of three exclusive-or gates, symbolically shown as a circle with a plus init. This placement of exclusive-or gates is the same as shown in FIG. 2. The diagram in FIG. 3 shows the simulation states on the structure from an initial state on the top row through five consecutive shift cycles, to the bottom row. The simulation uses symbolic values A,B,C,D, and E applied on successive shifts, at the Scan_In port and shows the next state of the scan-chain after each shift cycle. On the $3^{rd}$ shift (fourth row) a variable Z is introduced, on the $4^{th}$ shift variables Y and W are introduced, and variables S,T and U are introduced on the fifth (and last) shift cycle. These variables are used as placeholders for the expressions they are equivalent to. This example demonstrates that setting the symbolic values so that A=0, B=1, C=1, D=0, E=1 satisfies the conditions represented by the EXOR equations as well as achieving the desired values in the Care-in positions, but requires creating, referencing, and evaluating numerous EXOR expressions to set the proper symbolic values. Furthermore, it can be seen that the equations build upon the equations that already exist, making it impossible to substantially reduce or avoid the computation on shifts that have little or no chance of producing a correct result. As a result, the inventors have developed a non-symbolic compression algorithm that avoids the overhead of creating, referencing and evaluating EXOR expressions, by placing the existing states, and the symbolic values applied to the Scan-In Port, hereafter called variables, into arrays along with 0 (zero) values as placeholders, and evaluating what would have been the constructed expressions by indexing into these existing state and variable arrays with knowledge of the shift cycle and the locations of the exclusive-or gates.

In the first preferred embodiment of the invention, the basis for the Non-Symbolic compression algorithm comes from the observation that when simulating exclusive-or functions inserted in the scan string, the expressions created in symbolic simulation consist of variables exclusive-ored together, and those variables are completely position predictable. Table 1 below illustrates this principle:

TABLE 1

| Column # | |0 | 1 | | 2 | 3 | 4 | 5 | 6 | 7 | 8 | 9 |
|---|---|---|---|---|---|---|---|---|---|---|---|
| Scan string | |* | . | | . | * | . | . | * | . | . | . |
| Care-in | | | |c1 | . | c2 | c3 | . | . | c4 | c5 | c6 | . |
| Old Values | |0 | 0 | | 0 | 0 | 0 | v0 | v1 | v2 | v3 | v4 |
| New Values | |e | d | | c | b | a | 0 | 0 | 0 | 0 | 0 |
| | |0 | 0 | | 0 | e | d | c | b | a | 0 | 0 |
| | |0 | 0 | | 0 | 0 | 0 | e | d | c | b | a |
| | |0 | 0 | | 0 | 0 | 0 | 0 | 0 | e | d | c |
| Seg Locations | 0 | 3 | | 5 | 7 | | | | | | |

Table 1 contains an example of the compression computation, for the same segmented scan string at the same end point shown in the prior art in FIG. 3. This is the point where five shifts of the scan string have already occurred on a scan string such as shown in FIG. 2, which shows a scan string with exclusive-or logic elements 11,12, and 13 inserted before shift bits 3,5 and 7, when counting the first shift bit as 0. This table illustrates the process of evaluating values at specific locations, which require multiple variables without using an intermediate expression containing the variables. The numbered columns in Table 1, above, correspond to the shift bits in FIG. 2. The second row of Table 1, labeled Scan string, contains "*."s in the string locations, which are driven by the primary input 14, either directly or indirectly, through the exclusive-or gates 11,12 and 13, shown in FIG. 2. The scan bits in the scan string are signified by "." in this row(including the "." in the locations that contain "*."). The next row contains Care-in values, c1 through c6, with the rest of the values set to don't care, signified by the periods. These are the desired states the compressed vectors should create. The fourth row of Table 1 contains the Old Values, the existing values in the scan string prior to this test, and are shifted to the right five columns (with 0s inserted), because that is the state after five shifts. The fifth row, labeled New Values, contains the list of variables, corresponding to the, yet to be determined, new compressed values, which, when properly set, will decompress into a vector that has values equivalent to the known Care-in values c1 through c6. The $6^{th}$, $7^{th}$ and $8^{th}$ rows show the same variables shown in the fifth row, but as they would appear if they were shifted into the scan bits following the exclusive-or gates 11,12 and 13 respectively, or as they would be addressed if the index into the fifth row array was adjusted by adding the locations of the exclusive-or gates to the index. The list of these locations is shown in row nine, labeled Seg Locations.

Clearly, since this is the fifth shift, there are five variables shifted in. Combining the variables is done vertically. Given 0s where there are no variables a constant number of exclusive-or operations, equivalent to the number of segments+1, may be done to evaluate each position in the scan string. This is easily translated into the exclusive-or of different segment locations. By inserting 0s to the left in the Old Values array, the Seg Locations determine the locations of the values of the New Values array to exclusive-or together with the Old Values for each location, which are then compared with the required Care-in values at that location. In other words, only three rows (Old Values, New values, and Care-in) are needed. For example calculating the value in column number 7 consists of exclusive-oring locations (7−0=7),(7−3=4),(7−5=2), and(7−7=0) together with v2, but these are:

v2+0+a+c+e, . (where+ is an exclusive-or function), but this, is equivalent to the terms in column 7 in the above array, which are also equivalent to the symbolic expressions for that location when using symbolic simulation, namely in FIG. 3, U=Z+E, and Z=C+A, and v2=0, the value of the third bit on the top row, which when combined is A+C+E.

In order to ensure the proper care-in values result from shifting in the compressed values the variables a,c and e must be set such that c5=v2+a+c+e. This process, the rest of the algorithm to determine the proper values of the variables, is described below.

Figure 1:
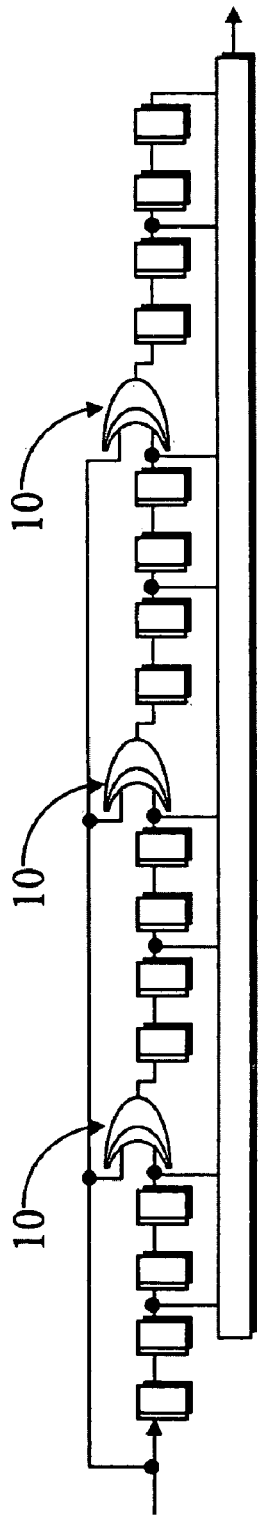
FIG. 1 is a prior art diagram of a segmented scan string.

In general, the technique of inserting exclusive-or gates into a shift register or scan string as shown by the examples in FIGS. 1 and 2, transforms the shift register or scan string into a lossless decoder. Typically, the symbolic simulation algorithms used to encode data for a lossless decode begins with a simulation model of the lossless decoder in some existing state, and involves:
1) setting the existing states into the lossless decoder model,
2) adding variables into the lossless decoder model's inputs,
3) simulating one cycle of the model, retaining the variables in expressions that are constructed to be equivalent to the logical operations performed by the simulation,
4) solving for the variables by successively applying values to the variables in a manner to optimize the likelihood of making the evaluation of the expressions associated with desired states equivalent to the desired states,
5) repeating steps 2 through 4 until all desired states are equivalent to the evaluations of their associated-expressions.

So in general, any algorithm employing the construction and evaluation of logical expressions to encode data for a lossless decoder can be transformed into an algorithm that evaluates the necessary expressions without creating data structures for the expressions, by properly indexing into an array of values and a separate array of variables, in a manner that is equivalent to the traversal of the constructed expressions. The above algorithm is then transformed into:
1) setting the existing states into an existing states array
2) adding variables into a variables array for each input of the model,
3) simulating one cycle of the model, separately manipulating the existing states and variables arrays,
4) solving for the variables by successively applying values to the variables in a manner to optimize the likelihood of making the evaluation of expected states associated with desired states equivalent to the desired states, and
5) repeating 2 through 4 until all desired values are equivalent to the evaluations of their expected states.
Where the evaluation of expected states is done by properly selecting and combining existing states and variables, from their arrays.

Now, with this in mind, a Non-symbolic Vector based compression algorithm is outlined below.

First, assume the following:

Old is the Old Values array (set of existing values from the last test);

New is the New Values array (a set of variables corresponding to the set of compressed values);

Care-in is the Care-in array (the set of desired values);

Seg_List[0:N_seg-1] is a list of the segment break locations;

N_seg is the number of segments;
Shift is the number of shifts;
Used is an array of logical flags for the use of this variable in any care-in locations; and
Stack is a stack of variable location numbers.

The algorithm is based on the: combination of shifting the old values out of the old array (and inserting 0s), while starting with 0s in the new array and shifting in variables. The evaluation of the values in each of the locations where a care-in value exists is done in a manner consistent with the example shown in Table 1 above. To determine the value for ith column location, one may merely exclusive-or the Old value at that location with the locations in the New array as adjusted by subtracting off the exclusive-or locations as follows:

Set the Value to Old[i], and,
For each segment of the string,
set index=i-Seg_List[j], and
if index is in range then exclusive-or New[index] to the Value Note that the range of the New array is from 0 to the size of the scan chain. When Seg List[j]>i or i>size of the scan chain+Seg List [j] the computed index will be out of range.

Now the process of compression consists of checking these evaluated values against the care-in values, and if they don't match, then shift and try again. Shifting consists of incrementing the shift count, shifting the Old values by one, putting a 0 in the first location of Old Values, and setting all the variables in the New array to unknown as follows:

Increment Shift,
Move all bits on the Old array right 1 location,
Set Old[0] to 0,
Set the first Shift number of locations in New array to unknown;

When comparing the required care-in values to the calculated values, computed by the evaluation process above, the order of selecting care-in locations is important. It must be done so as to minimize the computation of resolving the compressed variables values. This can be done by determining the number of variables set to unknown and first forcing the values on the locations having only one variable set to unknown. Then the process can successively resolve the other variables until all shift bits match the care-in required values. Since the current calculated value (without the unknowns) exclusive-ored with the care-in value is the desired value of the single variable set to unknown, it is easy to set known values on single variables. This requires a process that is more complex than the simple evaluation above. A more complete version of the evaluation process above would return the number of variables set to unknown, the location of the last variable, and the value (without including variables set to unknown)of a position in the Old and New arrays that contains a required care-in value. The evaluation process shown below applies to the ith location in the Old and New arrays and allows further processing when there are unresolved care-in locations with multiple variables set to unknown:

Set the Value to Old[i],
Set the number of unknowns to zero, and
For each segment of the string,
set index=i-Seg_List[segment #], and
if the index is in range and the variable in New[index] has an unknown value then
increment the number of unknowns,
set the unknown location to index, and
increment Used[index],
otherwise if the index is in range then
exclusive-or the New[index] value with Value.

Note that the Used array is incremented if the variable is contained in any expressions associated with any of the care-in locations.

Now the process of determining what the variable's proper values should be consists of clearing the Used array and looping through all the care-in locations. For each care-in location, the evaluation routine above then increments the count in the Used array, of each variable set to unknown, to obtain the current usage count of those variables (henceforth called unknown variables or unknowns).

When there are care-in locations whose evaluations include multiple unknowns, in order to ensure all possible combinations of the variables are tried, it is necessary to select one of the unknown variables, set it to 0 and push the variable identifier (column location) onto a stack, so if 0 is the incorrect value, the functions can later be evaluated with the variable set to 1. The variable that is contained in the most equations is the most likely variable to further resolve the locations with unknowns, when set, so that variable is selected and set to 0.

In the event the arbitrary setting of a selected unknown variable to 0 does not result in a set of values on the variables in the New array, which when evaluated at care in locations, equal the required care-in values in those locations, not only must that variable be set to a 1, but all other variables that were set to known values in the attempt to resolve the care-in location evaluations must be reset back to the state they were in when the selected unknown variable on the stack is set to a 1. This is equivalent to resetting to an unknown state all the other single unknowns that were subsequently set to a known state after this selected unknown variable was set to a 0. This can be done, when necessary, by adding the single unknowns to stack. One way to properly stack and remove both single unknown variables and selected unknown variables on the same stack is to include their type along with their locations on the stack, as is inferred in the process for setting unknown variables outlined below:

Loop Through Each of the Care-In Locations with Known Values;
For each such location, evaluate the value at that location, and
a) if there are more than 2 unknown variables, skip to the next care-in location,
b) if there is 1 unknown variable, set it to its proper state, if any selected variables are on the stack, add the single variable to the stack,
Start over at the beginning of the loop
c) if there is no unknown variable and the value equals its care-in value, continue to the next location.
d) if there is no unknown variable and the value does not equal the care-in value, exit the loop.

After Looping Through All the Care-In Locations Take the Following Actions:
1) If all care-in locations were state c), save pattern, and exit
2) If any care-in locations were d) then
  i. if there are any-variables on the stack then
    1. successively pop all single variables and set them to unknown value
    2. pop the next selected variable
    3. set the selected variable to 1 and
    4. repeat looping through care-in locations
  ii. otherwise, quit and go to next shift.
3) If all care-in locations were c) or a), then do the following at i. select the unknown variable in the most care-in locations
ii. push the variable onto the stack
iii. set the variable to 0
iv. repeat looping through care-in locations This process continues until one of the end conditions is met, and either the Old array is shifted to the right, and increment Shift (next shift) or the resulting compressed pattern meets the care-in requirements and the first N values in the New array are saved as the compressed values for this pattern, where N equals the number of shifts. Then the top level of the algorithm merely continues to shift until it works. The rest is reading the pattern, creating the data structure, and resetting the New array to 0s.

Figure 4:
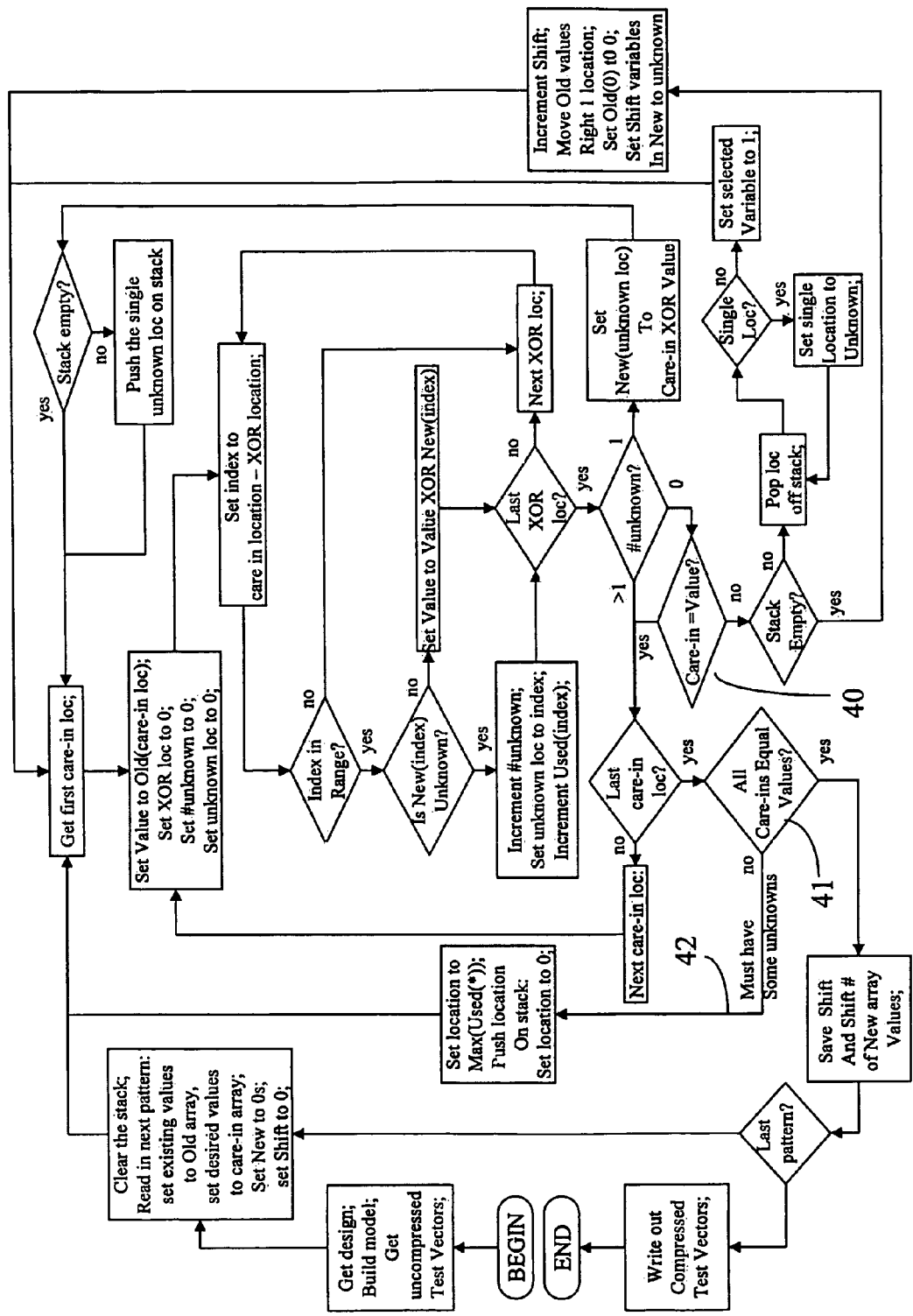
FIG. 4 is a flowchart of the non symbolic forward simulation algorithm.

FIG. 4 is a flowchart of the above algorithm in its entirety. The flowchart shows a decision 40, which branches out of the Loop described above when any value without unknowns is not equal to the care-in value at that location. In this decision tree, case 2) in the algorithm above is executed at this point, which leaves the decision 41, "all the evaluated Values at the care-in locations equal their care-in values", which makes the no branch 42 equivalent to case 3) in the algorithm above, since if any values at care-in locations don't equal their care-in values, there must be unresolved unknown variables at that location.

In yet another embodiment of the invention, similar computation to what was done in a forward shifting manner above may be done in a reverse shifting manner, with similar results. In other words, expanding on the example in Table 1 above, rather than shifting the Old values to the right, they are the desired values, and instead shift the Care-in values, which in this case are the existing values, and the New values to the, left, placing each new variable to the right of the last variable in the New array, as shown in Table 2 below. This is equivalent to shifting from the desired state to the starting state, or shifting in reverse compared to the normal operation of the hardware shown in FIG. 2.

TABLE 2

| Column | −5 | −4 | −3 | −2 | −1 | \|0 | 1 | 2 | 3 | 4 | 5 | 6 | 7 | 8 | 9 |
|---|---|---|---|---|---|---|---|---|---|---|---|---|---|---|---|
| Scan string | | | | | | \|* | . | . | * | . | . | * | . | . | * |
| Care-in | | c1 | . | c2 | c3 | \|. | . | c4 | c5 | c6 | . | | | | |
| Old Values | | 0 | 0 | 0 | 0 | \|v0 | v1 | v2 | v3 | v4 | v5 | v6 | v7 | v8 | v9 |
| New Values | a | b | c | d | e | \|0 | 0 | 0 | 0 | 0 | 0 | 0 | 0 | 0 | |
| | 0 | 0 | 0 | a | b | \|c | d | e | 0 | 0 | 0 | 0 | 0 | 0 | |
| | 0 | 0 | 0 | 0 | 0 | \|a | b | c | d | e | 0 | 0 | 0 | 0 | |
| | 0 | 0 | 0 | 0 | 0 | \|0 | 0 | a | b | c | d | e | 0 | 0 | |
| Seg Locations | | | | | | 0 | 3 | 5 | 7 | | | | | | |

In both Table 1 and Table 2 the vertical bars "|" mark the beginning of the scan string. In Table 2 since five shifts have also occurred, there are five care-in locations and five New Values locations to the left of the bars. In both cases the variables are chosen in alphabetic order. The variable a is introduced in the first shift, b in the second, c in the third, d in the fourth, and e in the fifth. In other words, the order of the variables are reversed between Table 1 and Table 2, because the shifting (and time) are in opposite directions, and while this results in different variables in the equations, created by exclusive-oring (signified by +) the Old and New variables in each column and equating it with the care-in in that column, namely: $c1=a$, $c2=c, c3=d+a, c4=v1+d+b, c5=v2+a+c+e$, and $c6=v3+d+b$ for Table 2 and $c1=e, c2=c, c3=b+e, c4=v1+b+d$, $c5=v2+a+c+e$, and $c6=v3+b+d$ for Table 1. When the variables are reversed, a for e, b for d, d for b and e for a, the equations derived from Table 2 are identical to the equations derived from Table 1.

The most significant difference between the two methods is the amount of locations required to process the compressed data, but this can be alleviated by noting that there can be no care-in values above column five, because they were shifted left five times, which suggests the last five locations in the table can be eliminated, and both methods would use the same amount of storage. The Table 3 below is Table 2 adjusted to reflect this observation. In Table 3, the column numbers have been realigned to match the numbering in Table 1. The Old values are shifted five places to the right. Because of the column realignment, the care-in values where left they were, and exclusive-or locations (Scan string breaks) were moved five places to the right, along with the Old values. Because of the shifting of the exclusive-or locations, the variables in the New Values array are placed to the left of the exclusive-or locations, after each successive, shift of the Scan-string.

TABLE 3

| Column | 0 | 1 | 2 | 3 | 4 | 5 | 6 | 7 | 8 | 9 |
|---|---|---|---|---|---|---|---|---|---|---|
| Scan string | | | | | | * | . | . | * | . |
| Care-in | | c1 | . | c2 | c3 | . | . | c4 | c5 | c6 | . |
| Old Values | | 0 | 0 | 0 | 0 | 0 | v0 | v1 | v2 | v3 | v4 |
| New Values | a | b | c | d | e | 0 | 0 | 0 | 0 | 0 |
| | 0 | 0 | 0 | a | b | c | d | e | 0 | 0 |
| | 0 | 0 | 0 | 0 | 0 | a | b | c | d | e |
| | 0 | 0 | 0 | 0 | 0 | 0 | 0 | a | b | c |
| Seg Locations | 0 | 3 | 5 | 7 | | | | | | |

In this example the primary differences in the reverse, algorithm over the forward algorithm are as follows:

1) The evaluation of the Values exclusive-ors the New array variables with the care-in values, not the Old array values,
2) The resulting evaluated values are compared with the Old array values, not the care-in values,
3) the scan string designators are shifted to the right on each shift,
4) the New variables are set to the left of the exclusive-or locations, and
5) the resulting New variables order is reversed before saving.

Figure 5:
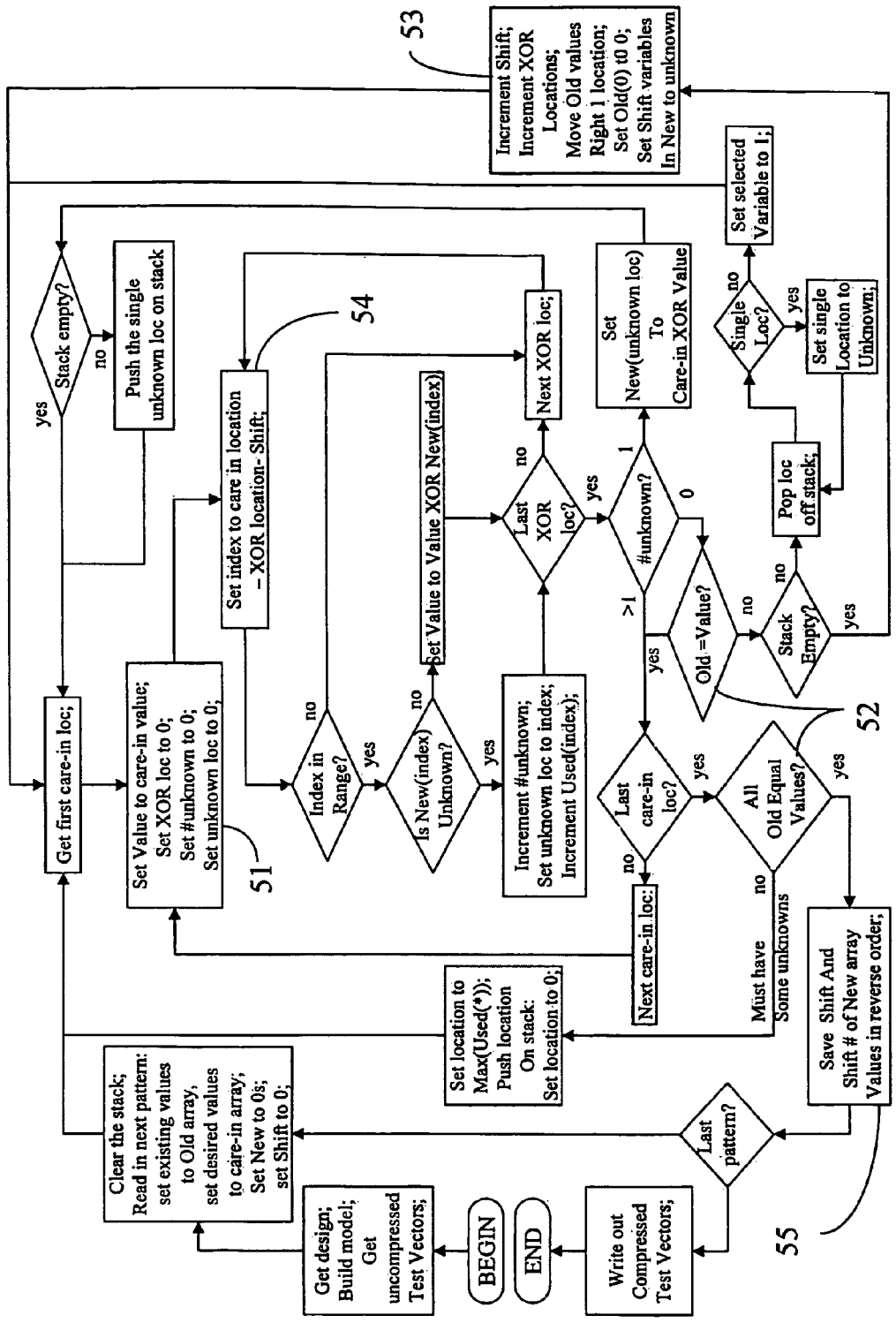
FIG. 5 is a flowchart for the non-symbolic reverse simulation algorithm.
Figure 6:
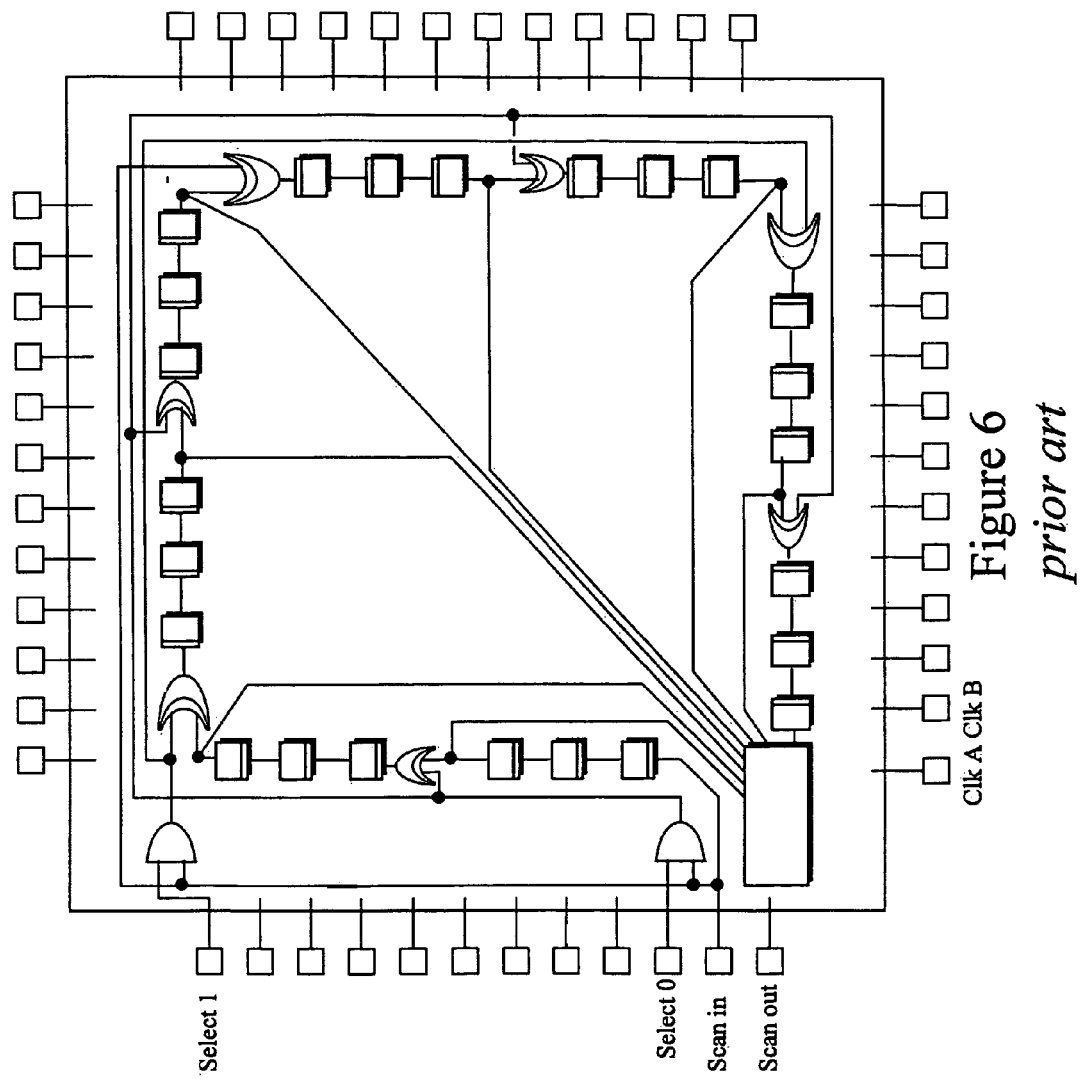
FIG. 6 is a prior art diagram of selectively enabled exclusive-ors in a scan string.

As a result, a flowchart of the full reverse algorithm can be seen in FIG. 5. The differences between the forward and reverse algorithm are identified in the operations 51, 52, 53, 54 and 55 in FIG. 5, which correspond respectively to the differences 1 through 5, listed above.

Now, given a general lossless decoder in some initial state, the general algorithm to determine how to put the decoder into a specific target state is then:

1) setting the existing states into an existing states array,
2) adding variables into a variables array for each input of the model,
3) simulating one cycle of the model, separately manipulating the existing states and variables arrays,
4) solving for the variables by successively applying values to the variables in a manner to optimize the likelihood of making the evaluation of expected states associated with desired states equivalent to the desired states, and
5) repeating 2 through 4 until all desired values are equivalent to the evaluations of their expected states.

Where the evaluation of expected states is done by properly selecting and combining existing states and variables, from their arrays, and In forward simulation, the existing states are the initial state, the desired states are the target state of the decoder and the simulation proceeds forward in time from the initial state to the target state, or In backward simulation, the existing states are the target state, the desired states are the initial state, and the simulation proceeds backward in time from the target state to the initial state.

Nevertheless, in the specific example of shift registers and exclusive-or gates, regardless of whether the forward or reverse methods are used, if there are a large number of required care-in locations it will likely take a large number of shifts, which corresponds to a large number of unknown variables to evaluate. As a result the computation will likely require a large number of selected unknown values. As can be seen by the above algorithm, the process of pushing and popping selected unknown variables on and off the stack is equivalent to traversing a binary tree containing all possible combinations of selected unknown values. Clearly if N unknown variables are selected that can lead to $2^N$ cycles of looping through the care-in values. Unfortunately, this computation can become excessive, which requires techniques to minimize the computation expended on evaluating shifts that will not produce results.

As a result, in another preferred embodiment of this invention, the algorithm may be adjusted, on each shift, to successively evaluate the probability that a solution can be found and move immediately on to the next shift unless the probability of a solution is high enough. Such an algorithm will reduce computation because, for the forward version, shifting is merely a matter of shifting the Old values to the right, adding a variable to the New array and resetting all variables to unknown, which leads to the conclusion that, with the proper estimator, the computation for any shift can be limited to first determining the likelihood of a solution and then only determining what that solution is if there is a sufficient probability that one can be found.

The key to this reduced computation is the construction of a sufficiently accurate estimator, whose computation is bounded by the number of care-in values. Such an estimator can be constructed from the following observations:

1) if there are no unknowns in the New array and the care-in value does not equal the value in the Old array, this shift will not work,
2) for each care-in location where the New array has a variable, that variable will be used to determine the value of the care-in, and
3) the equations created to resolve the variable values can always be solved if the number of variables used in the Care-in locations with known values is greater or equal to the number of Care-in locations with known values.

The first observation is reasonably obvious. If any care-in value does not equal the Old value in that location, and there is no way to change it (by setting a variable in the New array), then of course this shift can not set all the care-ins to their proper state.

The second observation is not so obvious. Wherever a care-in value exists, a variable in the New array must be set to a known value. If the care-in value equals the Old value, no variables are needed, but if a variable exists at that location either it must be set to 0, or it must be set such that the exclusive-or of all the variables at that location is 0. This requires one variable to be set to a calculated value. Similarly, for the case where the care-in value does not equal the old value, the variable or combination of variables must equal 1 to ensure the new array will contain the care-in value. This also requires one variable to be set to a calculated value, either 1 or a value that will set the combination of variables present to a 1.

The third observation is a property of Boolean equations. Each care-in location with a known value where the New array has one or more variables constitutes an equation that must be resolved. By the way the algorithm works, after N shifts there are N variables in the New array. If none of these variables are present at K of the care-in locations, which have known values, then K variables are never used in any of the equations. As a result, that leaves N−K variables in M equations, where M is the number of care-in locations, which contain variables in the New Values array. The, other K locations contain no variables and hence immediately resolve good or bad. Now if N−K>=M, then there are more variables than equations and the equations can all be solved. On the other hand, if N−K<M, then there are more equations than variables, and whether the equations can all be solved depends on whether there exists a set of values for the variables that solves the excess equations.

Now from this third observation, and the fact that we have Boolean variables, one can conclude that the probability that M equations with N−K variables, where M>N−K, can be solved has a probability of $(\frac{1}{2})^{(M-N+K)}$. This can be seen by the fact that when one variable (which could have a value of either 0 or 1) is used in more than one equation, there is a 50 percent chance the two equations require the same value (00,11) out of (00,01,10,11). Extending this, if M>N−K then there are M−N+K values that are determined by other equations, and must be set to the proper state by probability, so the probability all are set to the proper values is $(\frac{1}{2})^{(M-N+K)}$.

In yet another preferred embodiment of the invention the estimator for each shift consists of the following steps:
Set all variables in-the New array to 0:
Do for each care-in value;
If the number of variables in the New array location=0 then
If Care-in value <> Old value then estimator=0 percent and exit;
Else
Set all variables in the new array location to 1;
Increment #equations;
End if;
End Do;
Estimator=Min($[\frac{1}{2}]^{(\# equations - Sum(New array))}$,100 percent)

In addition both forward and reverse algorithms may be available, allowing either a fixed choice, or selection based on the distribution of required care-in values. Now the algorithm would be as follows:
For each shift of each pattern,
if the estimated value >some fixed percentage then,
apply either the forward or reverse compression algorithm for this shift, and
if successful go on to the next pattern, otherwise go on to the next shift.

Preferably the estimated value above is the cumulative probability of success up to this shift, where the probability of success on any given shift is the Estimator value.

Typically, the greatest computation is when the compression algorithm must be applied to a specific shift that contains many variables in many care-in locations, so another technique may also be employed to further reduce the computation.

First change the estimator algorithm to create a Used array equivalent to the New array and perform the following steps:
  Set all variables in the New and Used array to 0:
  Do for each care-in value;
    If the number of variables in the New array location=0 then
      If Care-in value <> Old value then estimator=0 percent and exit;
    Else
      Set all variables in the new array used in the care-in location to 1;
      Increment #equations;
    End if;
  End Do;
  Estimator=Min([½]$^{(\# equation-Sum(New\ array))}$,100 percent)

After applying the estimator algorithm, the Used array contains the count of the number of care-in locations that use the variable corresponding to the location in the Used array.

So, in yet another preferred embodiment of the invention after estimation, usage counts of variables in care-in locations can be used to reduce the set of care-in locations that must be evaluated in the compression algorithms by performing the following:
1. Create a list of care-in locations;
2. Do for each care-in location in the list;
   If the care-in location-has no variables then
     delete this care-in location from the list; (because its value=its-Old value)
   end if;
   If the min of Used array values for this care-in location's variables is =1 then put this care-in location and the variable with Used value=1 on a stack;
     Decrement the Used array values for all variables in this care-in location;
     delete this care-in location from the list;
   end if;
   End-Do;
3. Repeat step 2 until no changes occur to the list;
4. execute a compression algorithm on the reduced care-in list;
5. Do for each care-in location on the stack;
   set variable on the stack such that calculated care-in value=Old value;
   End do;

In essence, this technique successively eliminates the care-in locations with unique variables, since regardless of the values of the other variables at that location, the care-in value can be fully determined by the value set on the unique variable. As a result this care-in location may be processed after all the other care-in locations are processed. Clearly, this technique is recursive since the elimination of a care-in location with more than the unique variable may, in turn, cause another care-in location to now have a unique variable.

When the combination of all these techniques is used, the computation necessary to determine the values necessary for a compressed pattern set can be greatly reduced over the prior art.

In yet another embodiment, the estimator alone may be utilized to provide a compression estimate, without actually producing the compressed pattern. In this case, the algorithm would be:
  For each shift of each pattern ,
    if the estimated value>some fixed percentage, then save this # of shifts for this pattern.
  Estimated compression factor=[number of patterns*length of strings]/[sum of # of shifts]

In another preferred embodiment of the invention, compression test data for multiple scan strings requires issuing only the number of clocks to each scan string as is required to load the compressed data for that scan string, which can be accomplished by disabling all the scan string clocks, and selectively enabling each of them on a transition of their data inputs.

Figure 7:
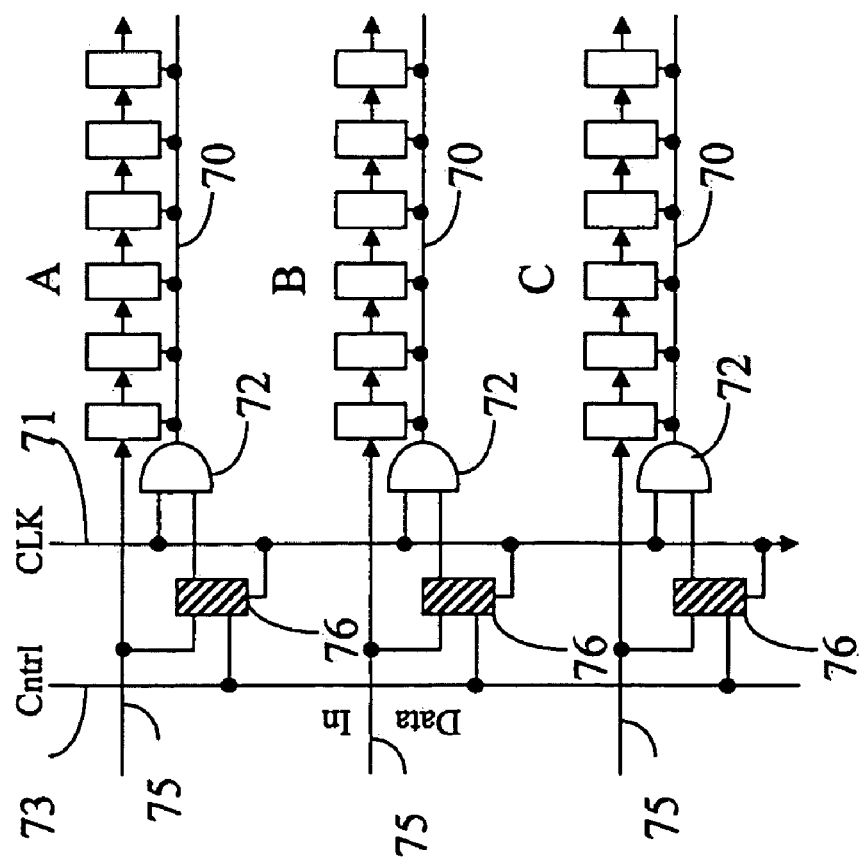
FIG. 7 is a prior art diagram of multiple scan string clocking.

Prior art in FIG. 7 depicts three scan strings, A,B, and C, each with separate control logic 76, to individually gate 72 the common clock 71 into each string's independently enabled clocks 70. In the prior art the control logic 76 enabled the clocks 70 on the clock cycle after the data in signal 75, for that string transitioned low, because it took one more clock cycle to set the data in signal 75 to its proper state. This extra clock cycle is eliminated when using the improved clock enable logic shown in FIG. 8 for the control logic 76 shown in FIG. 7. With this improved clock enable logic, when the control signal 73 transitions low the circuit is reset, loading a logic level 1 into the feedback flip-flop 80, and setting the clock enable 83 to enable the clock. At least one clock is then issued to capture the contents of the test state applied to the circuit. Prior to this clock, the data in signals 75 for each scan string should be set to a state opposite the first value to be scanned in. This can be done while the control signal 73 is set low. To begin scanning in the next set of data, the control signal 73 is set high, setting the clock enable 83 to disable the clock through the enable circuit 72 in FIG. 7. To begin scanning data into a specific scan string the data in signal 75 for that scan string is changed to the proper value to be shifted in. This transition is detected by the exclusive-nor logic 81 which compares the current state of the data in signal 75 with its prior state captured in a flip-flop 82, and then sets the clock enable 83 to enable the clock, and also sets a logic level 0 on the feedback flip-flop 80, to hold the clock enable 83 until a transition on the control signal 73 resets the circuit.

The timing diagram in FIG. 9 shows how a different amount of data can be scanned into each of the three scan strings A,B and C shown in FIG. 7, using the clock enable logic shown in FIG. 8. In FIG. 9, the three scan strings are enabled at different times. Scan string A is enabled to shift data on the first clock when the data in transitioned from logic level 0 to level 1, Scan String B on the second clock when the data in transitioned from logic level 1 to level 0, and. scan string C on the fourth clock, when the data in transitioned from a logic level 0 to a logic level 1, which were respectively then clocked into their respective scan strings. In this manner the additional clock cycle in the prior art, which was required set the data in line to a logic level 0 to, in turn, enable the scan chain's clock, is eliminated.

In yet another preferred embodiment of the invention, the basis for variable string, compression comes from the observations that: (1) the ratio of compression is related only to the number of segments created by the exclusive-or functions and the percentage of required care-ins to be set, and not the length of the scan string; and (2) the number of segments to produce the optimum, compression increases as the percentage of required care-ins decreases. Furthermore, the desirable placement of exclusive-ors is such that successive segments have monotonically increasing length. The reason for this can be seen in the example shown in FIG. 10. As compressed values are scanned into a scan string comprised of many sub-strings separated by exclusive-or gates 116, they are exclusive-ored with existing values into the first flip-flops of each sub-string segment 115. While this allows setting care-in bits in the scan string to their required values with fewer shifts, if many of the flip-flops within the column 115 are required to be set, conflicts can occur, requiring additional shifts until sufficient values have been scanned into the shift string to independently set all the care-in locations to their proper state. Furthermore, the shorter the scan string segments are at the beginning, the sooner the exclusive-or of multiple compressed values can occur, increasing the likelihood that the required care-in locations can be set to their proper states in fewer shifts.

The expected number of shifts, given relatively few required care-ins to be set, is approximately ½ the length of the longest scan string, because the shifting stops when either the existing shift bit values or the exclusive-or of the compressed input values and the existing shift bit values satisfy all the required care-in values. In the example shown in FIG. 10, this would be five. When a large enough set of care-in values exists to have multiple care-in values in a column such as 115 shown in FIG. 10, the shifting must continue until the exclusive-or of enough compressed input values occurs, which results in shifts greater than the length of a single sub-string. In addition, as was described above, the more sub-strings in the scan string, the more computation required to compress the test vectors.

Figure 10:
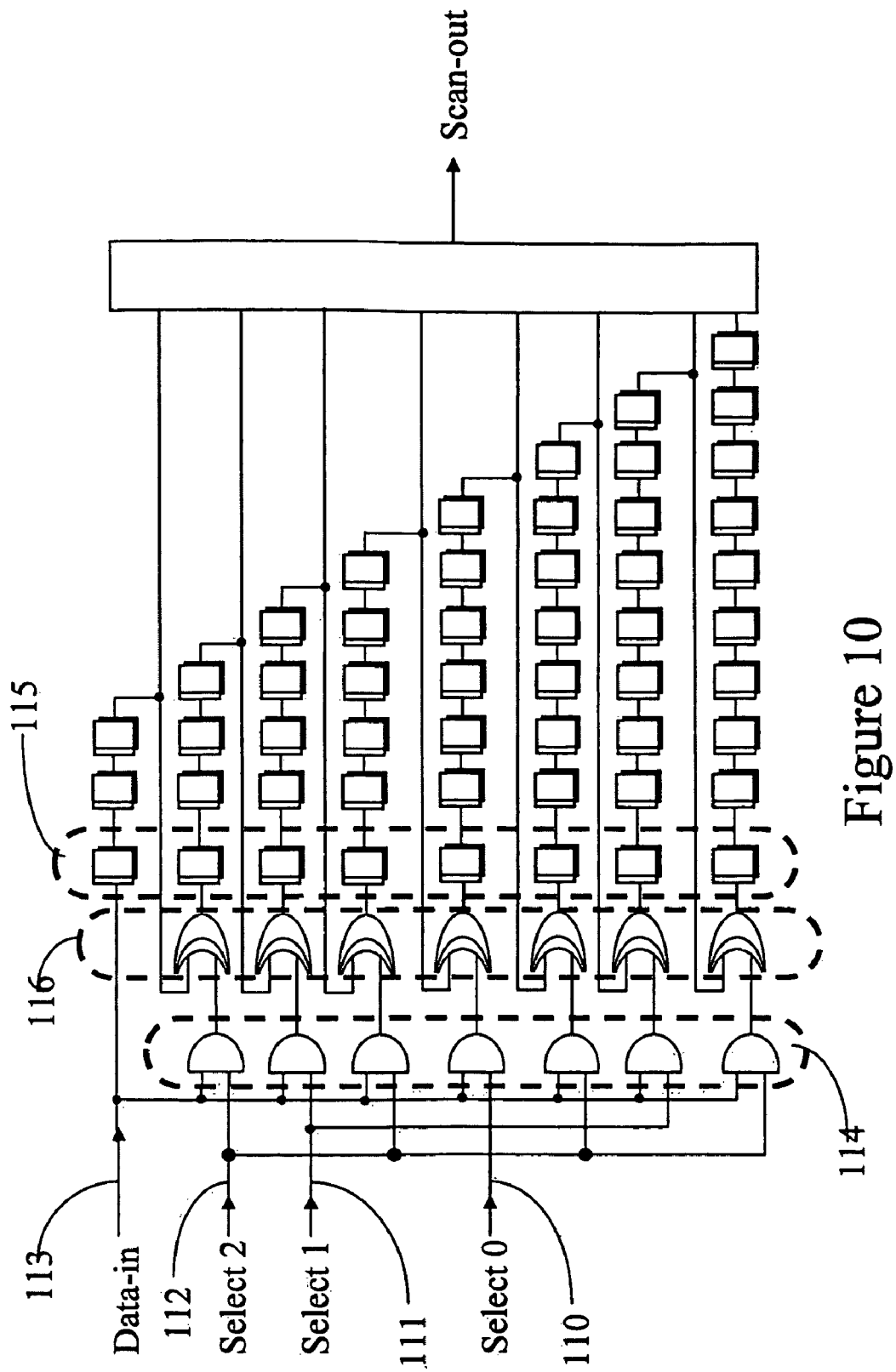
FIG. 10 is a diagram of improved selectively enabled exclusive-ors in a scan string.

As a result, it is desirable to begin with relatively few sub-strings, increasing the number as the percentage of care-in values decreases. This can be accomplished by including the AND gates 114 in front of each of the exclusive-or gates 116, gating the Data in signal 113 with one of an number of select control signals 110,111, and 112. In FIG. 10, setting all the select control signals to logic level 0 eliminates the exclusive-or of the input, making the scan string appear to be one sub-string. This is useful when debugging the chip, because no de-compression of the desired vector set is necessary. For the initial vectors with high care-in percentage the signal 110 can be set to logic level 1, thus bisecting the scan string into two sub-strings. Later, after a number of vectors have been compressed, the care-in percentage drops low enough, both 110 and 111 signals may be set to a logic level 1, to section the scan string into four sub-strings, and again, after many of the vectors have been compressed, and the percentage of required care-in values is much lower, all signals 110,111 and 112 may be set high to further bisect the sub-strings into a scan string with 8 sub-strings.

Figure 11:
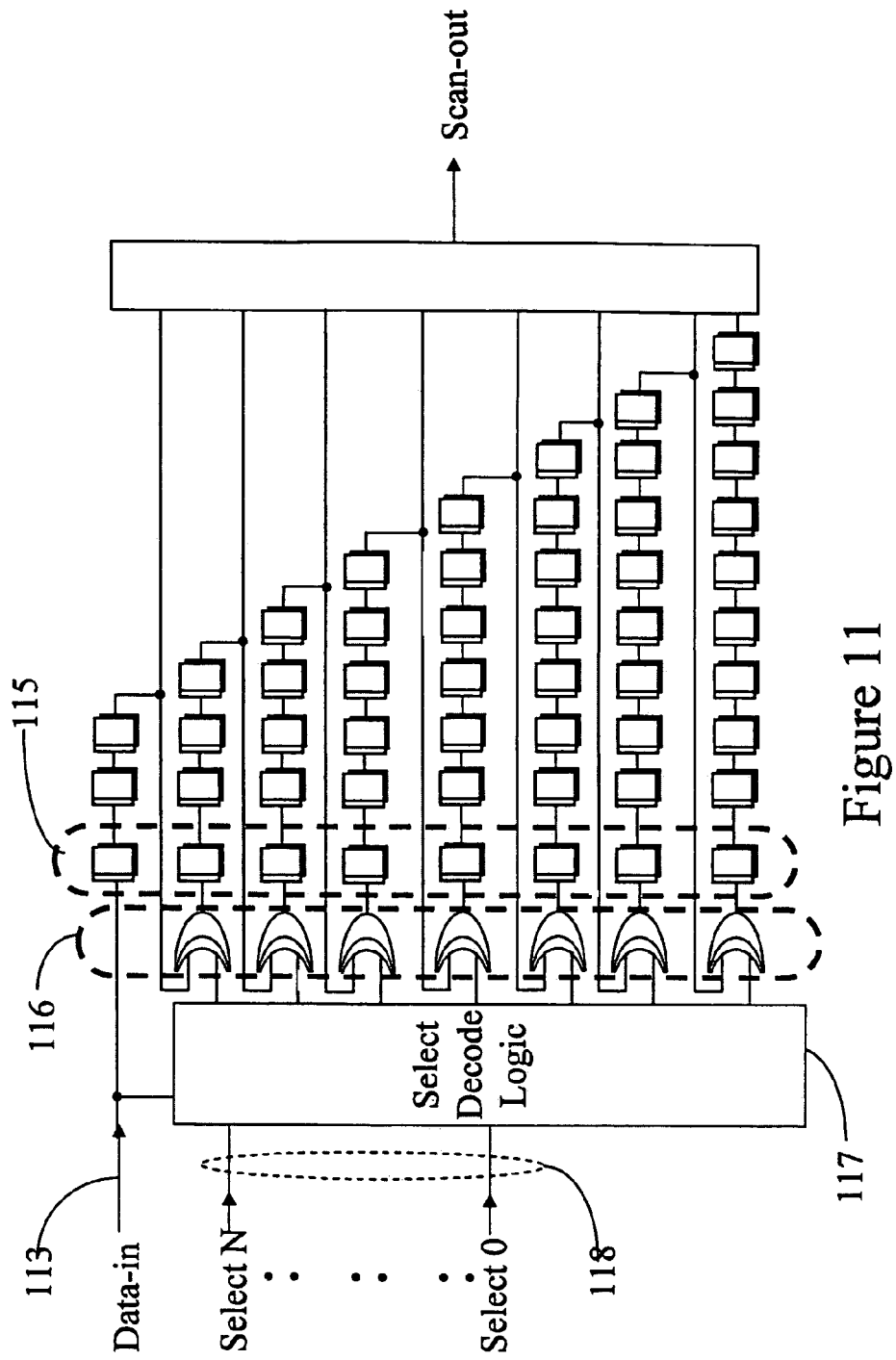
FIG. 11 is a generalization of the specific example in FIG. 10.

The example in FIG. 10 shows three select signals 110,111, and 112, which successively combine pairs of segments by selectively disabling the exclusive-or gates between them, up to the whole scan string, when all exclusive-or gates are disabled, but the inventors also recognize that there are any number of other ways to combine segments by disabling the exclusive-or gates, and any number of select lines could be used. For example in FIG. 11, a generalization of FIG. 10, many select lines 118 drive the select decode logic 117, which in turn controls the AND gates 116. In one such example, the binary value on the select lines 118 forms a count of the number of adjacent segments to be combined. The select decode logic 117 would then decode the count on the select lines and enable every Nth exclusive-or gate, when the binary value is N.

In another preferred embodiment, the select signals may be driven from bits in a special JTAG control register, which will not require any additional test pins, or a separate shift register loaded directly from a chip input pin. It is further contemplated that the compression may begin with no exclusive-or gates selected and may successively select an increasing number of exclusive-or gates when an evaluator reaches predefined levels, such as when. the last compressed vector compresses in less than some predefined percentage of the length of one sub-string, or when the product of the number of sub-strings times the percentage of required care-in values is less than some predefined value. It is further contemplated that any number of other techniques may be used to change the number of exclusive-ors that are selected on any given pattern.

In yet another preferred embodiment, the selective enabling itself may require enabling by a special key. In this case, without the key, the scan string(s) will operate as if no compression logic exists. By providing the proper key at the appropriate time, one or more of the select signals may be set, thereby breaking the scan string or strings into multiple segments. Furthermore, a set of keys could exist, each of which enables a different set of select signals such that the number of segments may be increased as the percentage of care-in values decreases.

Figure 12:
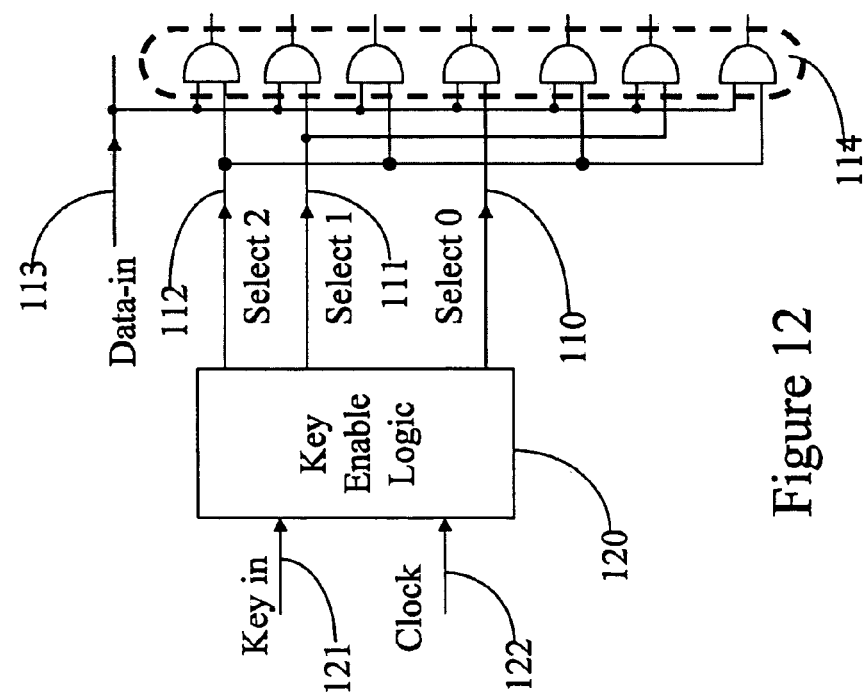
FIG. 12 is a diagram of the selective enables in FIG. 10 including key enabling logic.

FIG. 12 shows the selective enable logic in FIG. 10 with the addition of key enable logic 120, and its key input 121 and a clock 122. The key, enable logic sets one or more of the select signals 110-112 when the proper keys are clocked into it via the key input 121. If no key is clocked into it, none of the select signals are enabled, and the-scan chain operates as if no exclusive-ors functions exist.

Figure 13:
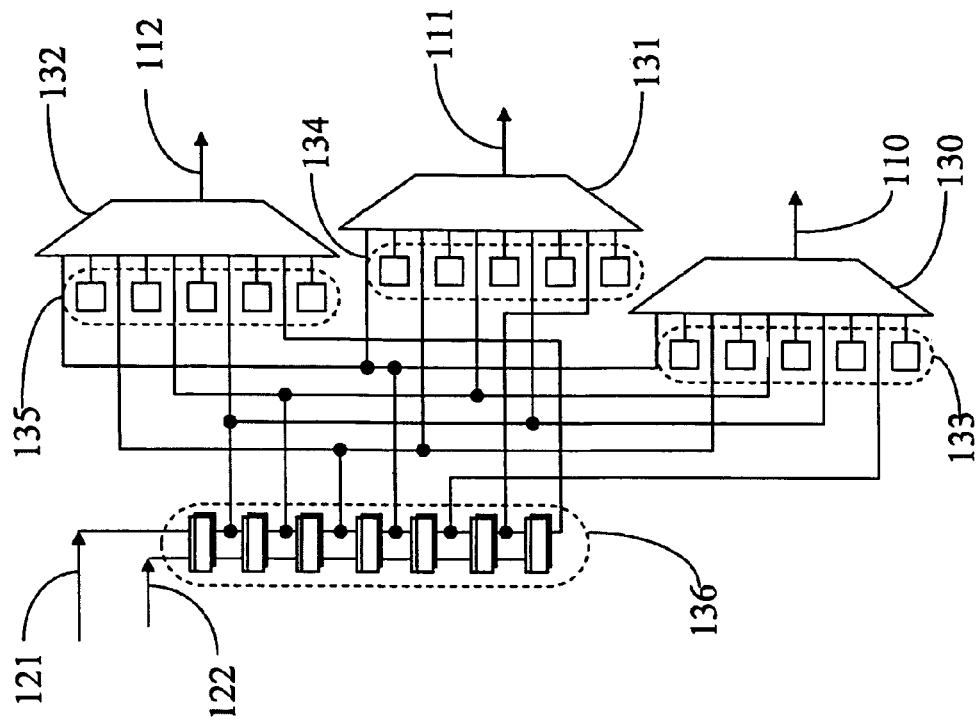
FIG. 13 is a detailed diagram of the key enabling logic in FIG. 10.

One embodiment of the key enable logic 120 is shown in FIG. 13. Here the key input 121 and clock 122 drive a seven bit shift register. 136, where each bit value is driven into one or more comparators 130,131, and 132, which compare the values from the shift register with preset bits 133,134 and 135 respectively. If the values shifted into the shift register 136 match the preset bit values 133, 134 and 135, each of the comparators 130,131, and 132 set their respective select signals 110,111, and 112. In this example each of the comparators is five bits wide, and the set of five bits out of the seven bits in the shift string is different. If the values shifted into the shift register 136 were [s2, s1, s0, k1, k2, k3, k4], the preset bits 133,134, and 135 would be compared to [s0,k4,k3,k2, k1], [s1,k4,k3,k2,k1], and [s2,k4,k3,k2,k1] respectively. In each case 4 of the 5 preset bits will be set to the same values [k1, k2, k3, k4], the basic key, and the fifth value becomes the key, s0,s1, and s2, to respectively and independently enable each select signal 110,111 and 112. Clearly this is just an instructive example.

Many other embodiments of the key enable logic may be employed. For example, the basic key should be much larger than 4 bits, to provide-adequate security, and the individual select signal keys could be a combination of the remaining bits, as opposed to the example where they are each independent Also the comparator logic may be merged for the basic key, and perhaps for parts of the individual keys as well. In addition, the comparator logic may include decoding logic to translate a numerical value into enabling specific combinations of select signals and a mechanism for detecting limits on these binary numbers. It is further contemplated that the shift register 136 may be incorporated into JTAG as a user register, or as a standalone structure. The clock 122 may be an independent clock or an appropriately enabled version of the system or test clock, and the values transferred into the key input may come from a regular input pin, the JTAG data in pin, or from one of the scan data inputs, given proper disabling of the rest of the test functions during loading of the shift register 136.

Figure 14:
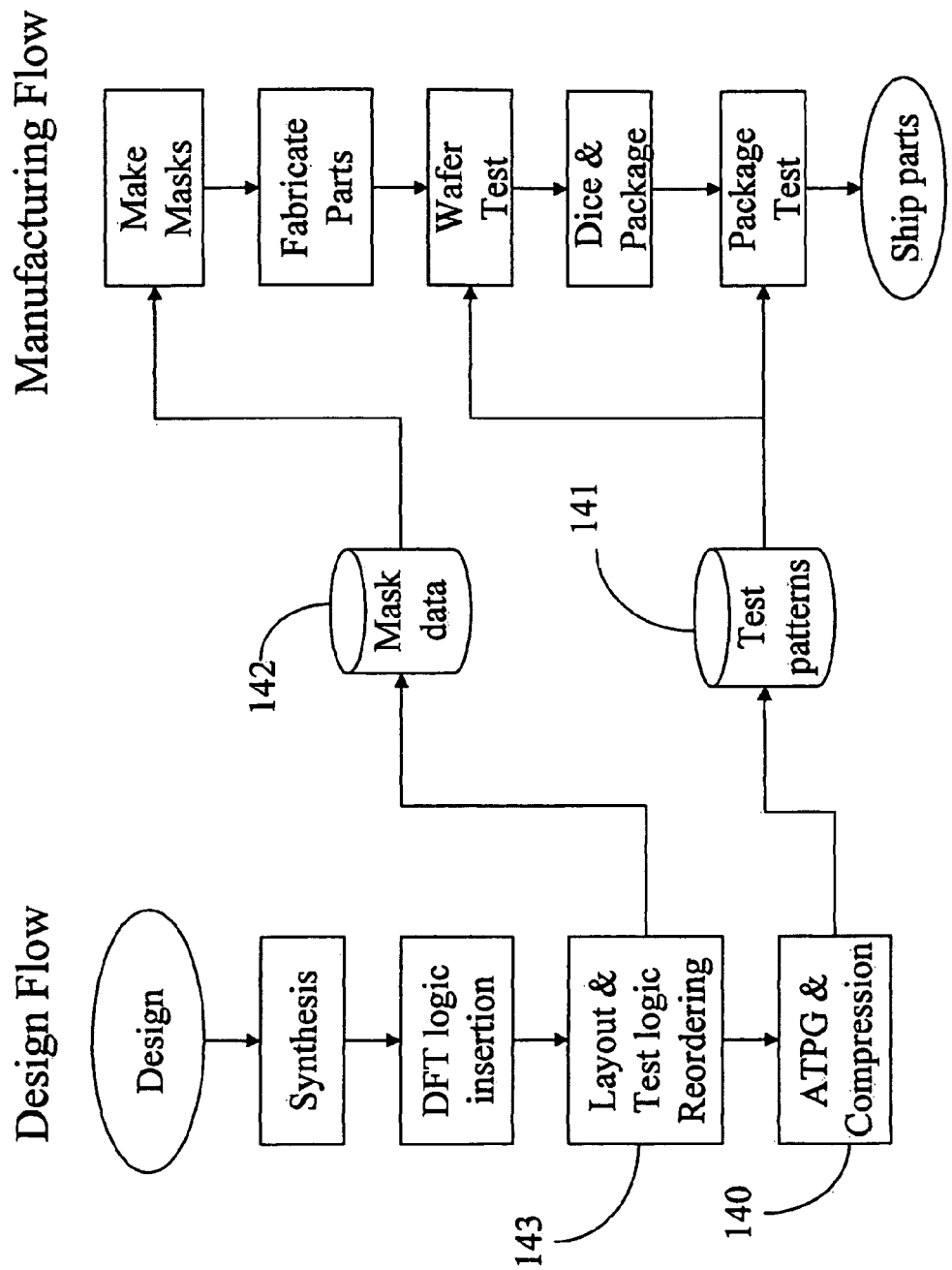
FIG. 14 is a diagram of the existing chip design and manufacturing flows.

As a result of this last embodiment of the invention, the traditional Design For Test (DFT) and Manufacturing Flows shown in FIG. 14 may be changed. Currently the test compression is done either during or following Automatic Test Pattern Generation (ATPG) 140, and a compressed or uncompressed pattern 141 is transferred to manufacturing along with the Mask data 142 from layout 143. Currently, test compression tools are sold to design teams or their electronic design automation (EDA) support groups, and because of the large potential savings in manufacturing that compression provides, the price for compression tools is very high. Unfortunately, the engineers designing the chips are often not certain of the chip's eventual manufacturing volume. As a result the design engineers are reluctant to buy the high priced compression tools, since they don't know if enough chips will be manufactured to make it economical. On the other hand, when the volume of chips in manufacturing is large, the manufacturing engineers would have preferred the design engineers had compressed the test patterns. By changing the design flow, manufacturing engineers can be given the option to compress or further compress the chip's test patterns to meet the target manufacturing test costs.

Figure 15:
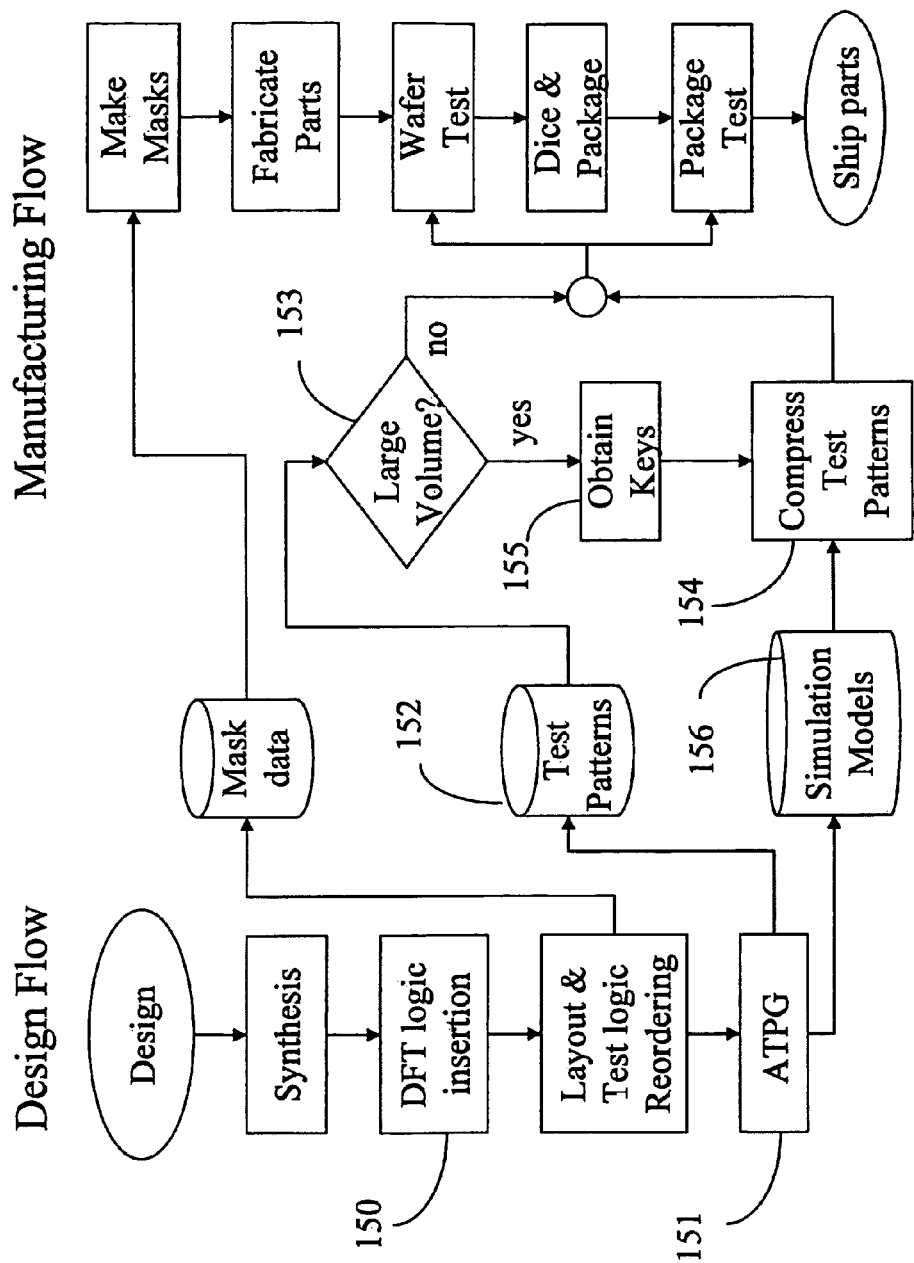
FIG. 15 shows the flows of FIG. 14 with improvements for test compression.

FIG. 15 shows how this can be accomplished, using the techniques described herein. For relatively low cost the design engineer can incorporate the compression logic described herein, including the key enable logic into his chip in step 150. The compression logic is turned off, so the design engineer performs the traditional, uncompressed ATPG 151, to create an uncompressed test pattern 152, which is transferred to manufacturing. The simulation model 156 of the chip is also transferred to manufacturing for possible later use. The manufacturing engineer then decides if the volume is large enough 153 to compress the test patterns 154 or to just use the uncompressed patterns transferred from the design engineers. Typically, the initial manufacturing run is very small volume. Just enough to verify the chip is good, so the manufacturing engineer may choose not to compress the test patterns at that time. After the chip has been verified, the planned manufacturing volume may then be high enough to make test compression economical. The manufacturing engineer then obtains the compression key or keys 155 from the EDA vendor and compresses the test patterns 152 using the simulation model 156 to create the new compressed patterns, which include the keys to enable the selective enable logic to perform the decompression.

Figure 16:
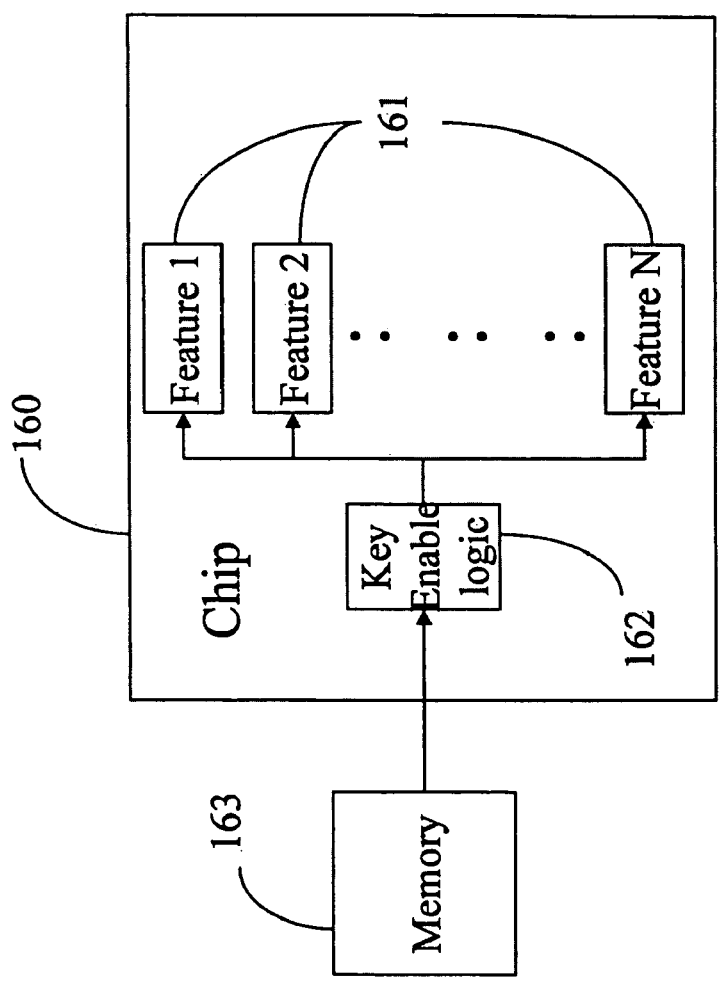
FIG. 16 is a diagram of a chip that uses key enabling logic.
Figure 17:
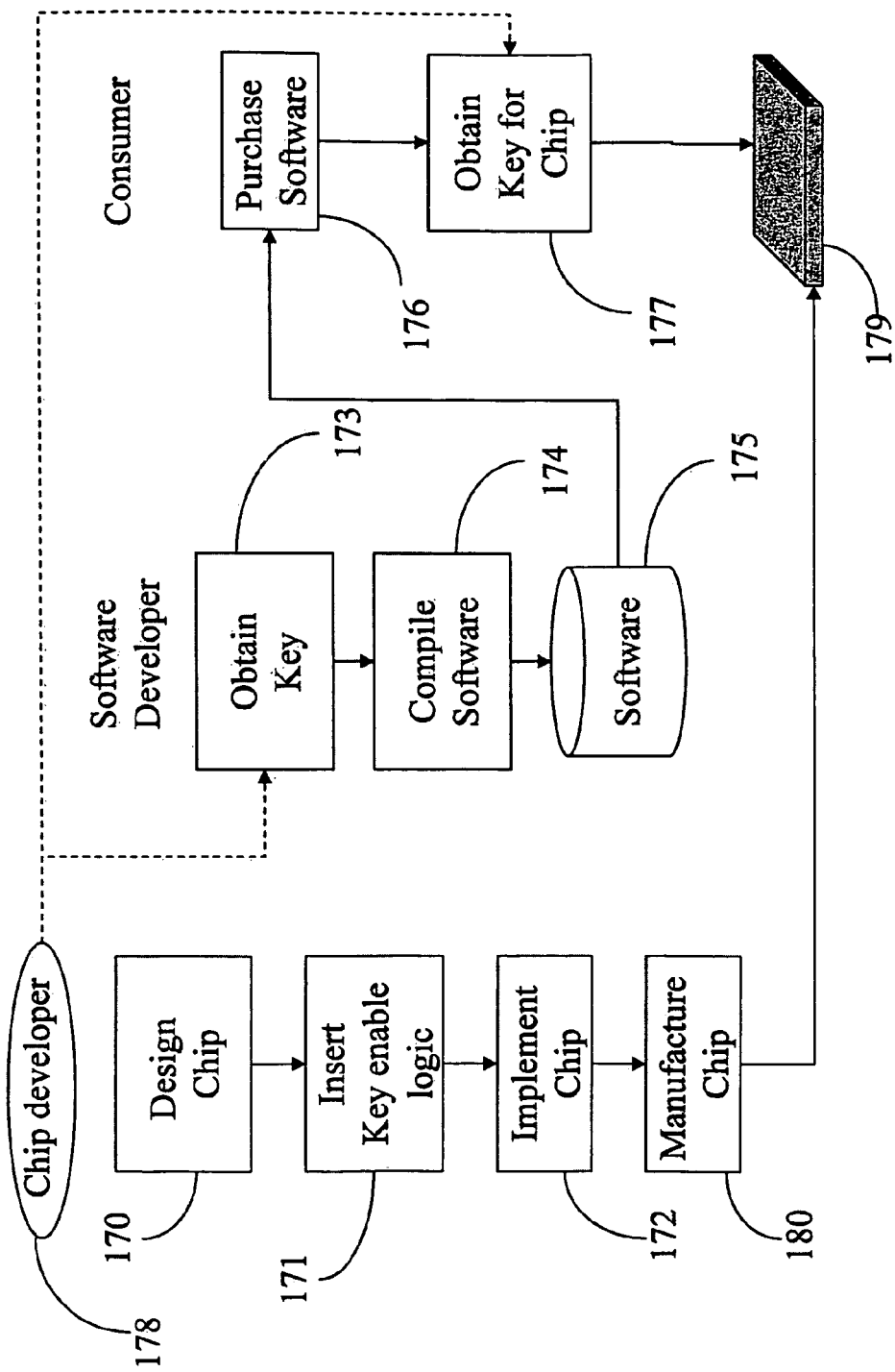
FIG. 17 is a diagram of the flow between chip manufacturers and software vendors utilizing key enabling logic.

In yet another embodiment this key enable concept is generalized to apply to any combination of key enabled features in a digital chip coupled with software that key enables such features for its use. FIG. 16 is a diagram of a digital logic chip 160, which contains a number of features embodied in logic blocks 161. Initially, all of these features are disabled, or partially disabled. When a proper key is transferred into the key enable logic 162 from memory 163 or other external data source, it will enable a specific predetermined combination of features. The key enable logic allows the proper keys to enable all combinations of the feature in the chip. One such example may be a processor chip, which contains a number of special hardwired complex instructions, which could replace slower, more memory intensive software routines. When software is created that utilizes these features, a key is provided by the chip manufacturer to enable the features in the chip running the software. The software first loads the key into the key enable logic to enable the features, and then utilizes the enabled features to accomplish its task. FIG. 17 shows a flow of hardware and software development and distribution to the customer which utilizes the technique. The manufacturer begins by designing the chip 170. Following the logical design, the key enable logic is added 171, the chip is implemented 172 and later manufactured 180. Independently, the software developer obtains a key 173 from the manufacturer 178 (presumably for a fee) and incorporates the key into their software 174. The software can now utilize the features of the chip.

In another embodiment of the invention, also shown in FIG. 17, the key enable logic could include the upper order bits of an on-chip clock, in place of some of the preset bits. In this case the comparator logic can compare the time against the key and enable the appropriate features only if the termination time in the key has not past. This provides the software developer a way to provide a time-limited license to the customer who purchases the software 176, and who then must periodically obtain a key 177 from the manufacturer 178 of the chip, which, when combined with the software, will enable the features to run on the chip 179. In this, as in other examples, it is desirable to have the feature be functionally transparent. In other words, in the example described above, the hardwired features, when not enabled, should result in a branch to software or firmware that accomplishes the same task. In another example, the speed of the communications between the chip and other external components, can be key enabled to have higher performance, but may continue to operate regardless of the availability of the key. Similarly, a single feature, such as the communications performance, can have different speeds determined by some combination of multiple selective enable lines.

In yet another embodiment, there may be a set of codes to enable any given set of features, the codes may further consist of multiple values loaded into separate registers at different times, and all such registers may be write-only to prohibit detection. For example, in FIG. 17, the key obtained by the consumer 177 may be. decrypted by a program into a set of codes, which are written into the key enable logic registers 162 in FIG. 16, at randomly different times, and the features are enabled only after all the codes have been properly written into the proper registers.

In yet another embodiment, some of the preset bits in the key enable logic may be programmable, so as to be uniquely set for each chip. These programmable preset bits could be constructed with fuses, antifuses, or EPROM to be externally programmable. Alternatively, some of the preset bits in the key enable logic may be manufactured with unique values for each chip, by placing or removing metal on a different set of preset bits for each die manufactured. This could be accomplished either by laser or ebeam patterning a mask step and subsequently depositing or etching a metal layer, or by directly etching or depositing metal through the use of Molecular Beam Epitaxy.

One idea behind this inventive compression technology is to take advantage of the existing state in the scan chain in order to reduce the number of required shifts needed to generate the next state. An artifact of this idea is that existing errors from one cycle can propagate through the decompression process to subsequent cycles of the testing, which is not beneficial when, during performance testing, the erroneous states put an otherwise good chip into a potentially destructive state. Previously, the only way to create a deterministic initial starting state was to shift it into the entire scan string.

So, in yet another embodiment of the present invention, a circuit may be added to scan strings, which when set will clear the shift stages beyond it such that a deterministic. compressed test may be generated. FIGS. 18*a* and 18*b* show a prior art circuit in which, when —Xmode 1809 and data_in 1805 are both set to 0, the data_out 1807 output is 0, regardless of the state of the previous scan bit 1806. The prior art shown in FIG. 18*a* teaches that such an X-blocking circuit 1801, when placed before tap points to a multiple-input shift-register (MISR) 1811, can ensure that any unknowns in the Old values may be cleared prior to reaching the MISR 1811. When, as shown in FIG. 19, this X-blocking circuit 1901 is place after the tap points to the MISR 1911 and before the exclusive-ors 1902 between the scan-chain segments, the X-blocking circuits 1901 are used to reset the flip-flops following the X-blocking circuits, while the care-outs are being captured. For example, by setting the Xmode input 1904 high and the Data-in input 1805 low, after four clock cycles all the flip-flops will contain 0s, and all the previous care-out values would have been caught in the MISR 1911.

Furthermore, in another preferred embodiment of the present invention, multiple scan strings may be reset without the need to selectively enable their clocks. When multiple chains are present, logic similar to what is used to control the clocks of multiple scan chains as shown in FIGS. 7 and 8 may be used to reset the chains instead of controlling their clocks, when modified as shown in FIGS. 20*a* and 20*b*. Each block 2001 in FIG. 20*a* contains the logic shown in FIG. 20*b*, which is identical in function to the prior art, with the addition of an inverter 2006 to invert the required data in value. When the Data-in inputs 2003 are set low and the control 2002 transitions from low to high, on the next clock 2005 the outputs 2004 from the blocks 2001 transition low until, some clock cycles later, the data in signals 2003 for each scan chain transition high. On the next clock cycle, the blocks' outputs 2004 transition high. The block outputs 2004 may then be use without the inverter 1906 as the -xmode signal 1907 into the X-blocking circuits 1901 shown in FIG. 19. Unlike controlling the clocks, the string with the longest compressed pattern is first clocked with enough cycles while its data input is low to guarantee 0s on all the flip-flops from the beginning of the string to the last care-in location, prior to changing the data in signal 2003, shown in FIG. 20. This ensures the initial scan chain is reset prior to inputting its compressed pattern. Thereafter, the reset continues on all the other chains until the number of cycles left to decompress the longest compressed pattern equals one more than the number of cycles necessary to decompress any of the other chains' patterns, at which time the data inputs on those specific chains are set high. One cycle later, the -xmode for the enabled chains is set high, and the first bit of compressed data is shifted into the chains. Resetting and decompression of the multiple chains' patterns continues until, on the last shift clock, all patterns for all the scan chains are decompressed. Throughout. this process, the clock 2005 continues to clock all the flip-flops on all the scan chains.

Unlike the selection of the tap points 1808 shown in FIG. 18, which are placed after the X blocking circuits 1801 to ensure the X values are not captured by the MISR 1811, the tap points 1908 in FIG. 19 are placed before the X blocking circuits 1901 to ensure the care-out values are captured before the previous states are reset.

Alternatively, if each shift register stage has a reset, the chains may be shifted until all strings have captured all their patterns' care-out values in their MISR(s) and then perform a single cycle reset. Since the compressed patterns are calculated from a scan chain containing all 0s, the subsequent scan chains in a multi-scan chain environment may be padded with 0s prior to the injection of their compressed values such that all chains are decompressed on the same clock cycle.

If X blocking is also needed, X-blocking circuits may be placed after the flip-flops with high expectation of containing unknowns. If this cannot be done the Xmode signal may have to be toggled on and off to propagate the care-out values through the X-blocking-circuit, while on later cycles blocking the propagation of unknowns. In this case, a multi-scan string design would require a separate external Xmode signal for each scan string, instead of the Xmode control logic shown. in FIG. 20*a*. Still, with sufficient cycles being reset, the clock enables will still not be needed.

In yet another embodiment of the present invention, test pattern compression with reset may be computed separately: from any ATPG or simulation programs. If the initial patterns generated from ATPG contain don't care values in all the non-care-in and non-care-out locations, each pattern can be compressed by assuming all 0s in the Old pattern, since the scan chains will be reset before decompressing the compressed patterns. Shifting the care-out-values into the MISR ensures the care-out values will be captured, regardless of the states of the non-care-out locations. In this fashion each pattern may be compressed entirely separate from any other pattern, since the previous state is not used in the generation of the next pattern. The resulting pattern contains compressed inputs, but no MISR signature data. After the entire test suite is compressed, the individual patterns maybe put into their final order and simulated on the actual segmented scan chains to obtain the correct signatures. If the MISR is turned off after capturing the care-out values, the resulting signatures apply only to the previously decompressed input data, not the next test's decompressed input data, and the resulting simulated patterns may subsequently be rearranged periodically throughout manufacturing test (perhaps in order to minimize the time to test failing chips), but if the MISR remains on and captures some of the values from the decompression of the next pattern, the patterns may not be reorganized after simulation.

As a result, in yet another embodiment of the present invention, the signature register is active only during reset and care-out capture, to maintain the independence of the compressed tests with reset. This is accomplished by enabling the clocking of the MISR flip-flops with the Xmode signal 1907 in FIG. 19. If care is taken to leave the Data-in signal 1905 low while Xmode 1904 is high, the MISR will only capture either reset 0s or the care-out values from the prior pattern. As soon as decompressed values enter the scan-chain, the Xmode signal is brought low, shutting off the MISR, keeping it from capturing the decompressed input values for the next test vector.

Figure 21:
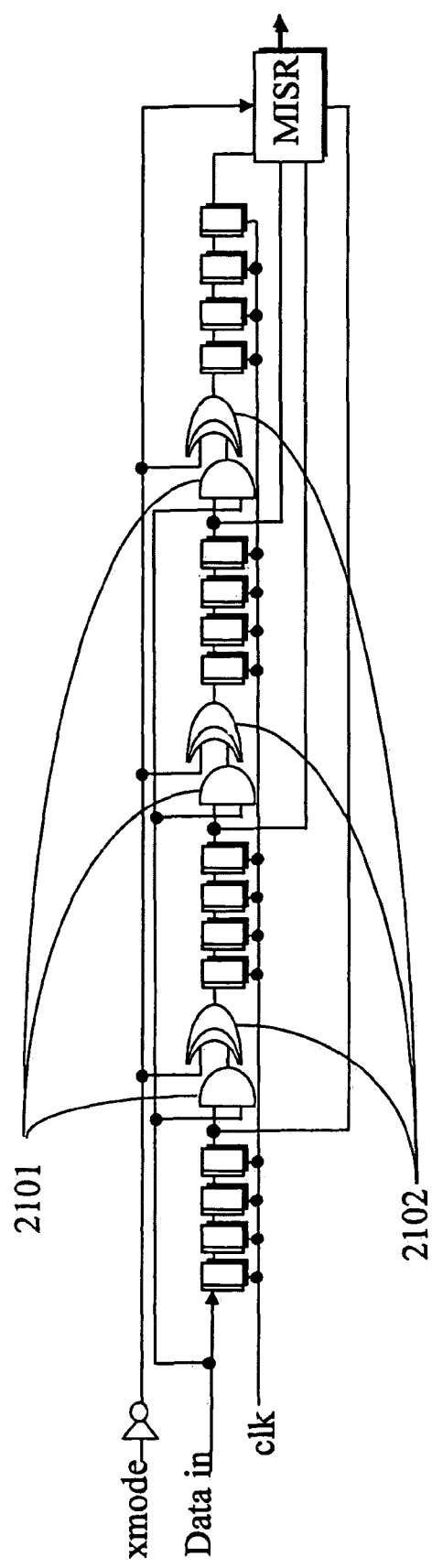
FIG. 21 shows a scan string as in FIG. 19 with X-blocking circuits replaced with AND gates.

It is further contemplated, as shown in FIG. 21, that an AND gate 2101 may replace the X-blocking logic, where the Xmode signal gates the previous flip-flop's state from propagating to the XOR gate 2102. In this case the Xmode signal may be toggled throughout the decompression of the next test, if it is driven from an external pin, to ensure at least the care-in locations are deterministically set. This, in turn, could leave unknowns in the next decompressed input pattern, which, after simulation, could propagate failures from prior cycles beyond the cycle in which they were detected.

Notwithstanding the embodiments and methods above, it is contemplated that the present embodiment of the invention may be used with any or all of the existing scan based methods and test techniques, including scan test compression, built-in self-test (BIST), hierarchical scan structures, and any other traditional scan techniques either referred to herein, or in other patents or papers readily available to the industry. In all such cases it is expected that the test time and data would be reduced, by the addition of these techniques.

It is further contemplated that the techniques in the embodiments described herein are not limited to any specific number or length of scan string. As such it is further contemplated that the above techniques may be used in part or in whole depending on the configuration scan logic they are applied to. It is further contemplated that equivalent functionality may be obtained by using different but logically equivalent types of structures, and that the methods described herein can be suitably modified by one well versed in the state of the art, to obtain similar results.

We claim:

1. A test structure in an integrated circuit (IC), the test structure comprising:
    key enable logic configured to accept a key input and to generate a plurality of select signals; and
    a plurality of scan-chain segments, wherein a first one of the plurality of scan-chain segments is configured to receive a primary serial input, and wherein each subsequent one of the plurality of scan-chain segments is configured to receive an input from an exclusive-or function of the primary serial input, gated by at least one of the select signals and an output of a previous one of the plurality of scan-chain segments;
    wherein the test structure is configured such that enabling a greater number of select signals corresponds to more compressed test vectors being enabled for use in testing the IC.

2. The test structure of claim 1, wherein the key enable logic comprises:
    a clocked shift register configured to receive the key input; and
    a plurality of comparators configured to compare subsets of outputs of the clocked shift register with sets of predetermined bit values and to generate the plurality of select signals.

3. The test structure of claim 2, wherein a state of the clocked shift register enables all of the select signals.

4. The test structure of claim 2, wherein the clocked shift register is a JTAG control register.

5. A structure for an integrated circuit (IC), the structure comprising:
    a plurality of logic blocks, wherein each logic block corresponds to a feature of the IC and is configured to be enabled by a select line; and
    key enable logic configured to drive a select line used to enable a respective one of the plurality of logic blocks;
    wherein each of the select lines is configured to enable a feature of the IC when a selected subset of bits for a key inputted into the key enable logic is equivalent to a set of preset bit values corresponding to a particular select line.

6. The structure of claim 5, wherein there is a particular key that will enable all of the features of the IC when loaded into the key enable logic.

7. The structure of claim 5, wherein each key is configured to be loaded into the key enable logic from a memory.

8. The structure of claim 5, wherein each key is configured to be loaded into the key enable logic from an external data source.

9. The structure of claim 5, configured such that a feature of the IC is selected when a subset of bits for a key inputted into the key enable logic is greater than upper order bits from an on-chip clock.

10. A method of fabricating an integrated circuit (IC), the method comprising:
    providing key enable logic configured to accept a key input and to generate a plurality of select signals; and
    providing a structure configured to receive and to respond to the select signals, wherein the structure is selected from a group consisting of:
        a plurality of scan-chain segments, wherein a first one of the plurality of scan-chain segments is configured to receive a primary serial input, wherein each subsequent one of the plurality of scan-chain segments is configured to receive an input from an exclusive-or function of the primary serial input, gated by at least one of the select signals and an output of a previous one of the plurality of scan-chain segments, and wherein enabling a greater number of select signals corresponds to more compressed test vectors being for use in testing the IC; and
        a plurality of logic blocks, wherein each logic block corresponds to a feature of the IC and is configured to be enabled by a select line, and wherein each of the select lines is configured to enable a feature of the IC when a selected subset of bits for a key inputted into the key enable logic is equivalent to a set of preset bit values corresponding to a particular select line.

11. The method of claim 10, wherein said providing key enable logic comprises:
    providing a clocked shift register configured to receive the key input; and
    providing a plurality of comparators configured to compare subsets of outputs of the clocked shift register with sets of predetermined bit values and to generate the plurality of select signals.

12. The method of claim 11, wherein said providing a clocked shift register comprises providing a JTAG control register.

13. The method of claim 10, further comprising configuring the IC such that a feature of the IC is to be selected when a subset of bits for a key inputted into the key enable logic is greater than upper order bits from an on-chip clock.

14. The method of claim 10, further comprising providing means to couple the key enable logic to receive a key from a source not located on the IC.

* * * * *